(12) United States Patent
Nam

(10) Patent No.: US 11,486,913 B2
(45) Date of Patent: Nov. 1, 2022

(54) ELECTRONIC DEVICE FOR DETECTING STUCK VOLTAGE STATE AND METHOD OF MONITORING STUCK VOLTAGE STATE

(71) Applicant: SAMSUNG ELECTRONICS CO., LTD., Suwon-si (KR)

(72) Inventor: Hyunseok Nam, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 214 days.

(21) Appl. No.: 17/007,446

(22) Filed: Aug. 31, 2020

(65) Prior Publication Data
US 2022/0026476 A1   Jan. 27, 2022

(30) Foreign Application Priority Data
Jul. 27, 2020  (KR) .................. 10-2020-0093284

(51) Int. Cl.
*G01R 19/165*   (2006.01)
*G06F 1/28*   (2006.01)
*H03K 17/687*   (2006.01)
*H03K 19/21*   (2006.01)

(52) U.S. Cl.
CPC ......... *G01R 19/16552* (2013.01); *G06F 1/28* (2013.01); *H03K 17/6872* (2013.01); *H03K 19/21* (2013.01)

(58) Field of Classification Search
CPC .......... H03K 5/22; H03K 5/24; H03K 17/687; H03K 17/6871; H03K 17/6872; H03K 19/007; H03K 19/20; H03K 19/21; G01R 19/165; G01R 19/16552; G01R 19/16566; G01R 31/31715; G06F 1/28; G06F 1/30; G06F 7/02
See application file for complete search history.

(56) References Cited

U.S. PATENT DOCUMENTS

| | | | |
|---|---|---|---|
| 5,610,826 A | 3/1997 | Whetsel | |
| 6,275,074 B1 * | 8/2001 | Hastings | .............. H03K 5/08 327/205 |
| 6,763,487 B2 | 7/2004 | Whetsel | |
| 6,862,705 B1 | 3/2005 | Nesbitt et al. | |
| 7,130,340 B1 | 10/2006 | Jong et al. | |
| 7,274,203 B2 | 9/2007 | Tumin et al. | |
| 7,409,614 B2 | 8/2008 | Rich et al. | |

(Continued)

*Primary Examiner* — Long Nguyen
(74) *Attorney, Agent, or Firm* — Volentine, Whitt & Francos, PLLC

(57) ABSTRACT

An electronic device includes a driver that is connected with a pin, receives an input signal, and outputs an output signal to the pin in response to the input signal, a core circuit that transfers the input signal to the driver, and a monitor circuit that receives the input and output signals and detects a stuck voltage state of the output signal based on the input and output signals. The monitor circuit includes a first detection circuit that detects the stuck voltage state when the input and output signals are logically incorrect, a second detection circuit that detects the stuck voltage state when the input and output signals are logically correct and when the output signal is at a low level, and a third detection circuit that detects the stuck voltage state when the input and output signals are logically correct and when the output signal is at a high level.

17 Claims, 22 Drawing Sheets

(56) References Cited

U.S. PATENT DOCUMENTS

| | | | |
|---|---|---|---|
| 7,612,574 B2 | 11/2009 | Fujiwara et al. | |
| 7,877,652 B1 | 1/2011 | Schuelke | |
| 9,081,063 B2 | 7/2015 | Narayanan et al. | |
| 2021/0294365 A1* | 9/2021 | Yoo | G06F 1/3206 |

* cited by examiner

ELECTRONIC DEVICE FOR DETECTING STUCK VOLTAGE STATE AND METHOD OF MONITORING STUCK VOLTAGE STATE

CROSS-REFERENCE TO RELATED APPLICATIONS

A claim of priority under 35 U.S.C. § 119 is made to Korean Patent Application No. 10-2020-0093284 filed on Jul. 27, 2020, in the Korean Intellectual Property Office, the disclosure of which is incorporated by reference herein in its entirety.

BACKGROUND

Embodiments of the inventive concept described herein relate to an electronic device, and more particularly, to an electronic device which detects a stuck voltage state of an output driver and to a method of monitoring a stuck voltage state.

An electronic device such as a semiconductor chip (or package) is configured to communicate with an external device. The electronic device may include signal lines to receive signals from the external device and transmit signals to the external device. A voltage level of one or more of these signal lines may become stuck or frozen due to an error in manufacturing the electronic device or due to a progressive defect of the electronic device. Herein, the phrase "stuck voltage state" means a condition in which a voltage level of a given signal line is improperly fixed in place as the result of coupling with a power supply voltage VDD or a ground voltage VSS.

SUMMARY

According to an exemplary embodiment, an electronic device includes a driver that is connected with a pin, receives an input signal, and outputs an output signal to the pin in response to the input signal, a core circuit that transfers the input signal to the driver, and a monitor circuit that receives the input signal and the output signal and detects a stuck voltage stage of the output signal based on the input signal and the output signal. The monitor circuit includes a first detection circuit that detects the stuck voltage state when the input signal and the output signal are logically incorrect, a second detection circuit that detects the stuck voltage state when the input signal and the output signal are logically correct and when the output signal is at a low level, and a third detection circuit that detects the stuck voltage state when the input signal and the output signal are logically correct and when the output signal is at a high level.

According to an exemplary embodiment, an electronic device includes a power management integrated circuit that generates second voltages from a first voltage received externally and outputs the second voltages, and a processor that receives the second voltages from the power management integrated circuit and accesses the power management integrated circuit through a general-purpose input/output (GPIO). The power management integrated circuit includes a driver that is associated with the general-purpose input/output and outputs an output signal in response to an input signal, and a monitor circuit that receives the input signal and the output signal and detects a stuck voltage state of the output signal based on the input signal and the output signal.

According to an exemplary embodiment, a method of monitoring an output signal of a driver includes comparing an input signal and the output signal of the driver and detecting a stuck voltage state in response to the input signal and the output signal being logically incorrect, and adjusting a voltage of an output node when the input signal and the output signal are logically correct and detecting the stuck voltage state in response to a voltage of the output node not varying.

BRIEF DESCRIPTION OF THE FIGURES

The above and other objects and features of the inventive concept will become apparent from the detailed description that follows with reference to the accompanying drawings.

DETAILED DESCRIPTION

Figure 1:
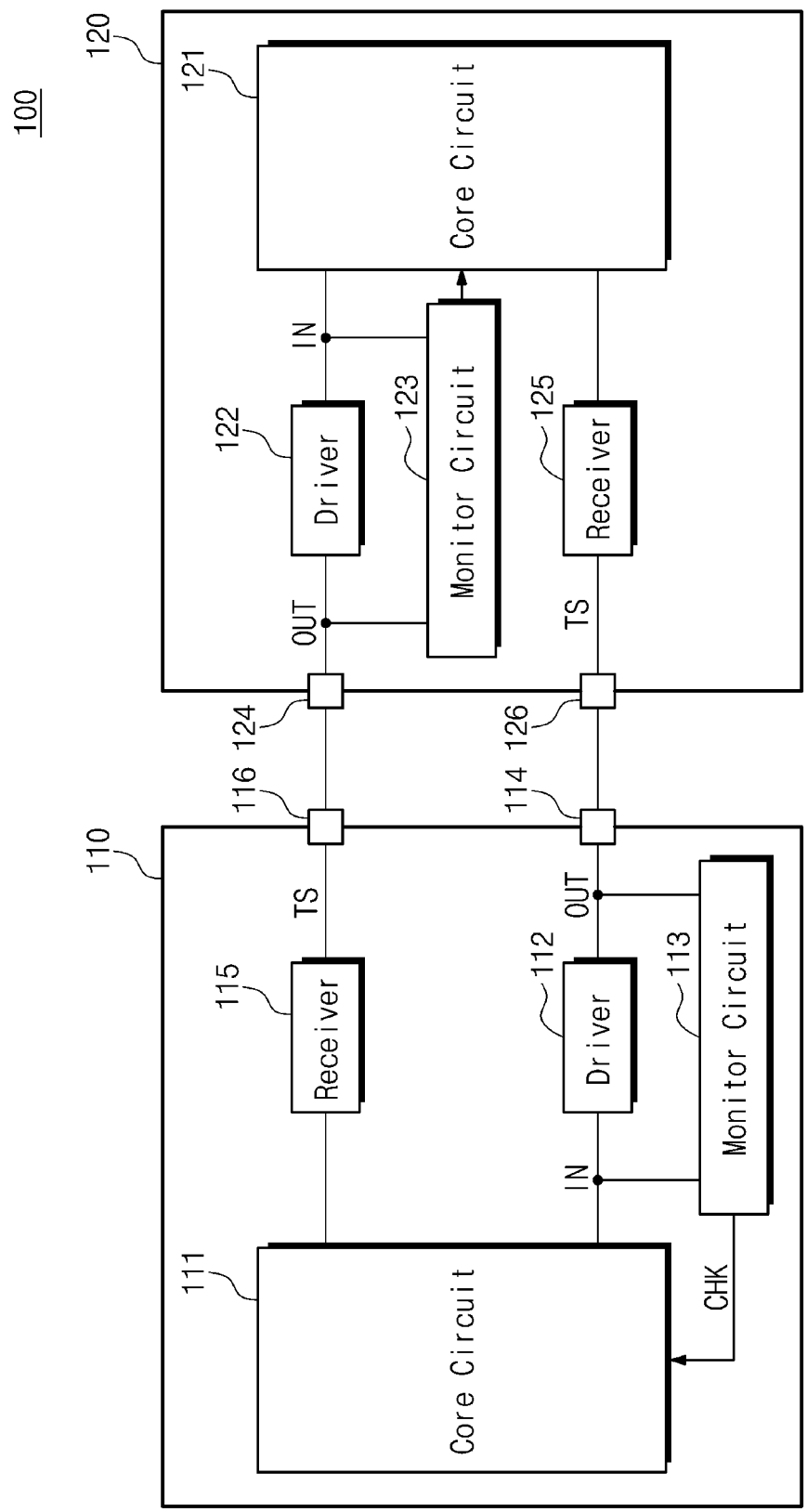
FIG. 1 illustrates an example of a system including electronic devices according to an embodiment of the inventive concept.

FIG. 1 illustrates an example of a system 100 including electronic devices 110 and 120 according to an embodiment of the inventive concept. Referring to FIG. 1, the first electronic device 110 and the second electronic device 120 may exchange signals.

The first electronic device 110 may include a core circuit 111, a driver 112, a monitor circuit 113, a first pin 114, a receiver 115, and a second pin 116. The core circuit 111 may perform operations intended according to a design and may exchange signals with the second electronic device 120.

The driver 112 may receive an input signal IN from the core circuit 111. The driver 112 may generate an output signal OUT from the input signal IN.

The driver 112 may transmit the output signal OUT to the second electronic device 120 through the first pin 114.

The monitor circuit 113 may receive the input signal IN and the output signal OUT. The monitor circuit 113 may detect a stuck voltage state of the output signal OUT based on the input signal IN and the output signal OUT. The stuck voltage state may mean that the output signal OUT is fixed to a power supply voltage VDD due to the connection of the output signal OUT with a power node or is fixed to a ground voltage VSS due to the connection of the output signal OUT with a ground node. When the stuck voltage state is detected, the monitor circuit 113 may activate a check signal CHK. In response to the activation of the check signal CHK, the core circuit 111 may determine whether the stuck voltage state is detected.

The receiver 115 may receive a transmit signal TS from the second electronic device 120 through the second pin 116. The receiver 115 may provide the received transmit signal TS to the core circuit 111.

The second electronic device 120 may include a core circuit 121, a driver 122, a monitor circuit 123, a first pin 124, a receiver 125, and a second pin 126. Operations of the components of the second electronic device 120 may be identical to the operations of the components of the first electronic device 110. Thus, additional description will be omitted to avoid redundancy.

A pin test of a conventional electronic device is performed by using dedicated test equipment, for example, automatic test equipment (ATE) or is performed by using built-in self-test (BIST) logic. The test using the ATE or the BIST logic is limited in that the pin test is performed before a system is activated or only in an initialization operation.

The monitor circuit 113 according to an embodiment of the inventive concept may perform the pin test in a state of suspending an operation of the first electronic device 110 or the second electronic device 120 while the first electronic device 110 or the second electronic device 120 operates. After the pin test is completed, operations of the first electronic device 110 and the second electronic device 120 may be resumed.

While the pin test is performed, a logical level (e.g., logical low or logical high) of a pin is maintained without modification. Accordingly, pins of the first electronic device 110 and the second electronic device 120 may be tested without influencing operations of the first electronic device 110 and the second electronic device 120.

For example, one of the first electronic device 110 and the second electronic device 120 may be a power management integrated circuit (PMIC), and the other thereof may be an application processor (AP). The drivers 112 and 122 and the receivers 115 and 125 may be general-purpose input/output (GPIO).

The system 100 including the first electronic device 110 and the second electronic device 120 may be an in-vehicle infotainment system. The monitor circuits 113 and 123 may comply with the automotive safety integrity level (ASIL) or the ISO26262.

The terms of the first pins 114 and 124 and the second pins 116 and 126 may be used, but a component through which each of the first electronic device 110 and the second electronic device 120 exchanges signals with the outside may be revised or applied by one of various components such as a pin, a pad, and a solder ball.

Also, an example is illustrated in FIG. 1 as the driver 112 or 122 and the receiver 115 or 125 of the first or second electronic device 110 or 120 are connected with different pins, but the driver 112 or 122 and the receiver 115 or 125 of the first or second electronic device 110 or 120 may share one pin.

Figure 2:
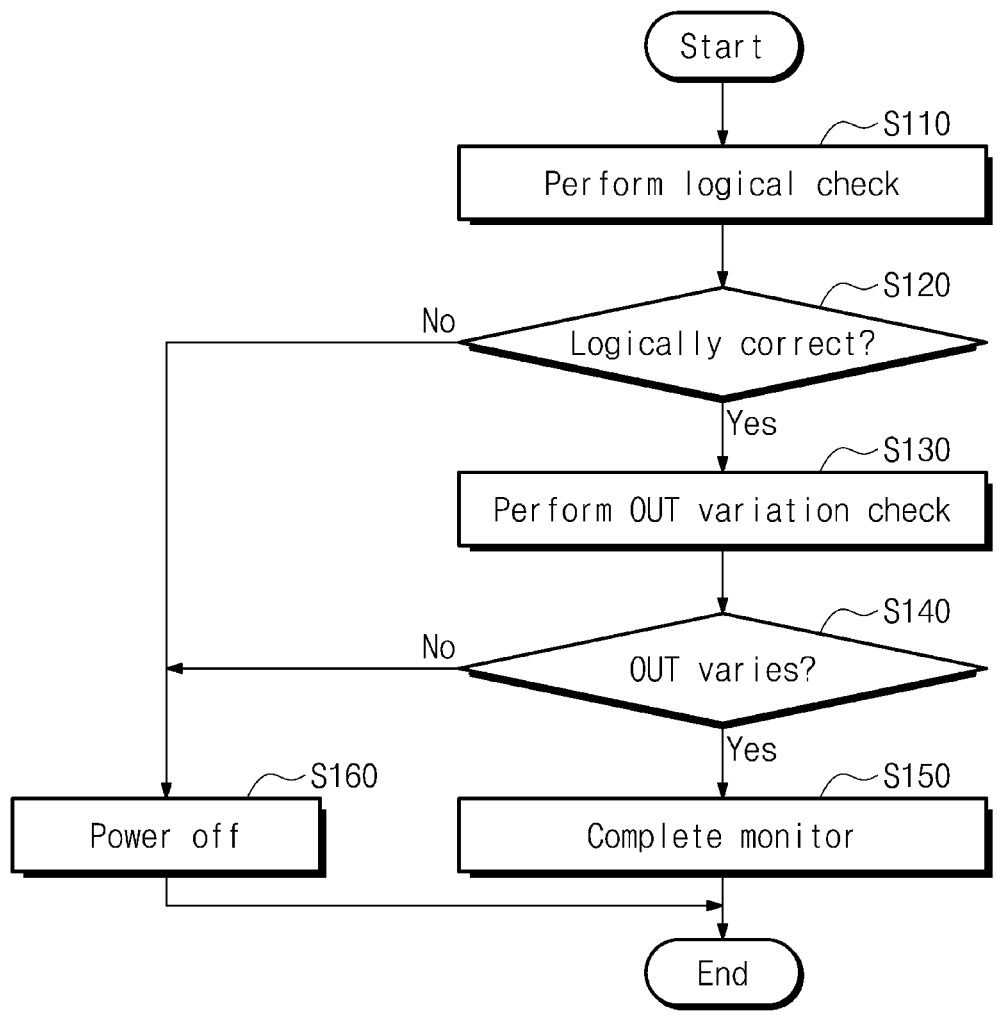
FIG. 2 is a flowchart for reference in describing an example of an operating method of an electronic device according to an embodiment of the inventive concept.

FIG. 2 illustrates an example of an operating method of the first or second electronic device 110 or 120 according to an embodiment of the inventive concept, for example, a method of monitoring an output signal of a driver. Referring to FIGS. 1 and 2, in operation S110, the first or second electronic device 110 or 120 may perform a logical check. The logical check may check whether a logical level of the input signal IN and a logical level of the output signal OUT are logically correct. When the logical level of the input signal IN and the logical level of the output signal OUT are logically correct, operation S130 is performed.

In operation S130, the first or second electronic device 110 or 120 may perform a variation check of the output signal OUT. The variation check of the output signal OUT may detect whether a level of the output signal OUT actually varies in the case of varying the level of the output signal OUT in compliance with a test procedure. When the output signal OUT varies, in operation S150, the first or second electronic device 110 or 120 may determine that a stuck voltage state does not occur and may complete the above monitoring process.

When it is determined in operation S120 that the logical level of the input signal IN and the logical level of the output signal OUT are logically incorrect or when it is determined in operation S140 that the output signal OUT does not vary, operation S160 is performed. In operation S160, the first or second electronic device 110 or 120 may determine that the stuck voltage state occurs and may perform an operation that is scheduled to be performed when the stuck voltage state occurs.

For example, in response to the occurrence of the stuck voltage state, the first or second electronic device 110 or 120 may perform power-off. Alternatively, in response to the occurrence of the stuck voltage state, the first or second electronic device 110 or 120 may inform an external device that the stuck voltage state occurs or may enter a sleep mode. To support the rechecking of the stuck voltage state, in a power-off state or in a state of entering the sleep mode, the first or second electronic device 110 or 120 may be powered on or wake under control of the external device and may again perform the monitoring process.

For example, the monitoring method of FIG. 2 may be performed in initialization or boot-up of the first or second electronic device 110 or 120. The first or second electronic device 110 or 120 may set the input signal IN to logical low and/or logical high and may perform the logical check and the variation check of the output signal OUT.

The monitoring method of FIG. 2 may be performed in a runtime of the first or second electronic device 110 or 120. The first or second electronic device 110 or 120 may set the input signal IN to logical low and/or logical high and may perform the logical check and the variation check of the output signal OUT. Alternatively, the first or second electronic device 110 or 120 may perform the logical check and the variation check of the output signal OUT on the present input signal IN.

For example, the first or second electronic device 110 or 120 may have a normal mode and a test mode. In the normal mode, the first or second electronic device 110 or 120 may perform normal operations according to a design purpose. In the test mode, the first or second electronic device 110 or 120 may monitor the stuck voltage state of the first pin 114 or 124 by using the monitor circuit 113 or 123.

Figure 3:
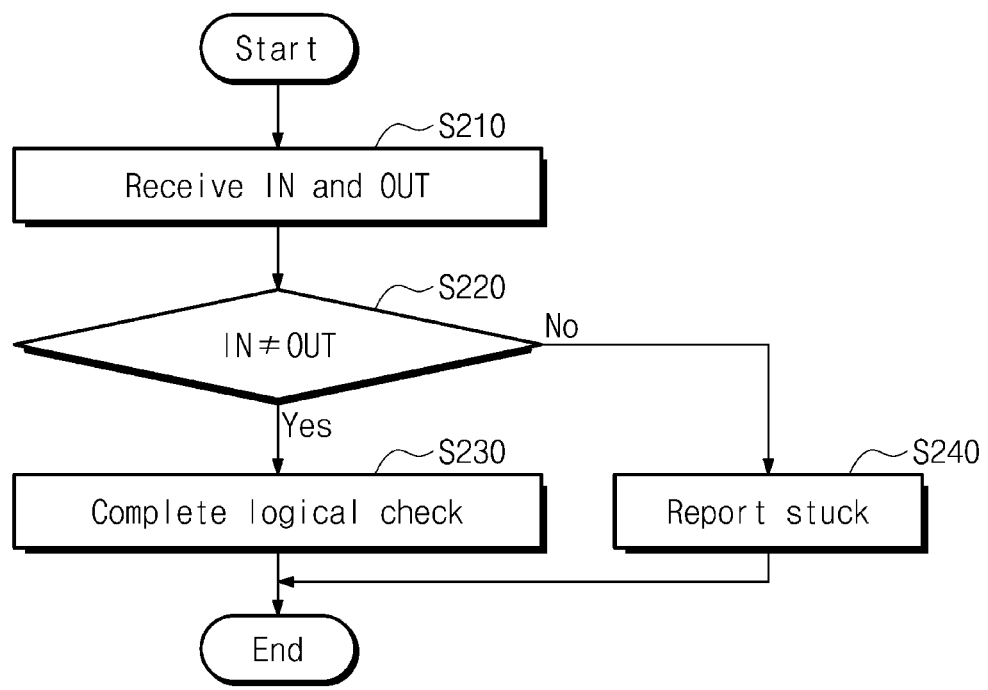
FIG. 3 is a flowchart for reference in describing an example in which a logical check is performed.

FIG. 3 illustrates an example in which a logical check is performed. Referring to FIGS. 1 and 3, in operation S210, the monitor circuit 113 or 123 may receive the input signal IN and the output signal OUT. In operation S220, the monitor circuit 113 or 123 may determine whether a logical level of the input signal IN and a logical level of the output signal OUT are different.

In response to that the logical level of the input signal IN and the logical level of the output signal OUT are different, in operation S230, the monitor circuit 113 or 123 may complete the logical check. In response to that the logical level of the input signal IN and the logical level of the output signal OUT are identical, in operation S240, the monitor circuit 113 or 123 may activate the check signal CHK to report the stuck voltage state.

For example, the drivers 112 and 122 may operate in an inversion driving scheme. For example, each of the drivers 112 and 122 may invert a logical level of the input signal IN to output the output signal OUT. When the drivers 112 and 122 operate in a non-inversion scheme, for example, when each of the drivers 112 and 122 outputs a logical level of the input signal IN as a logical level of the output signal OUT, the condition in operation S220 may be modified to determine whether the logical level of the input signal IN and the logical level of the output signal OUT are identical.

Figure 4:
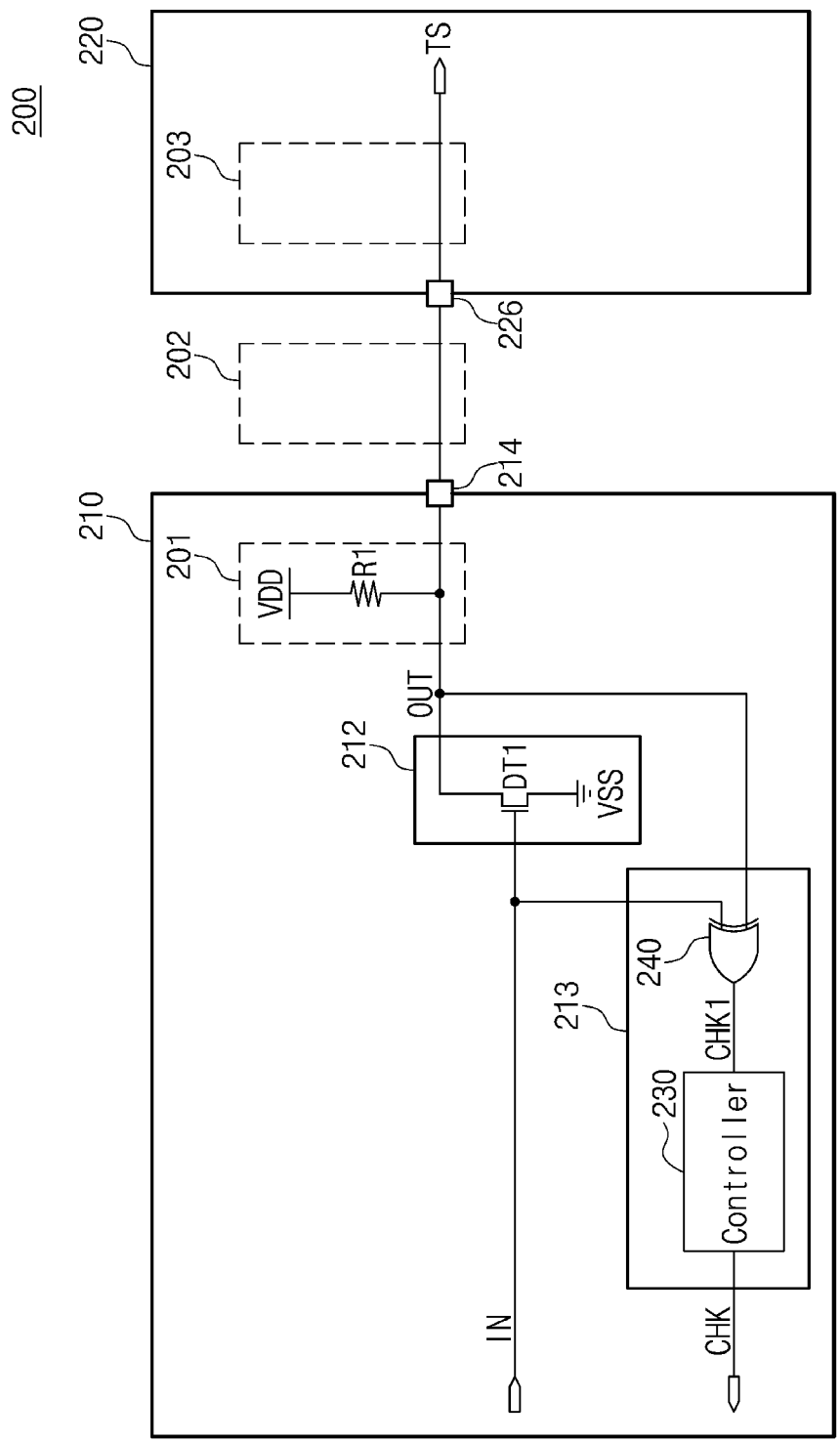
FIG. 4 illustrates a system including components for performing a logical check according to an embodiment of the inventive concept.

FIG. 4 illustrates a system 200 including components for performing a logical check. Referring to FIGS. 1 and 4, the system 200 may include a first electronic device 210 and a second electronic device 220. A first pin 214 of the first electronic device 210 may be connected with a second pin 226 of the second electronic device 220. The first electronic device 210 and the second electronic device 220 may correspond to the first electronic device 110 and the second electronic device 120 of FIG. 1, respectively.

A driver 212 may include a first drive transistor DT1. The input signal IN may be applied to a gate of the first drive transistor DT1. In response to the input signal IN, the first drive transistor DT1 may connect an output node, from which the output signal OUT is output, with a ground node to which the ground voltage VSS is applied.

The output node of the output signal OUT may be connected with a power node, to which the power supply voltage VDD is supplied, through a first resistor R1. The first resistor R1 that supplies the power supply voltage VDD to the output node may be provided at one of a first location 201 being within the first electronic device 210, a second location 202 between the first electronic device 210 and the second electronic device 220, or a third location 203 being within the second electronic device 220. An example is illustrated as the first resistor R1 is provided at the first location 201.

When the input signal IN is set to logical low, for example, the ground voltage VSS, the first drive transistor DT1 may be turned off. Accordingly, the output signal OUT may be set to the power supply voltage VDD, that is, logical high. When the input signal IN is set to logical high, for example, the power supply voltage VDD, the first drive transistor DT1 may be turned on. Accordingly, the output signal OUT may be set to the ground voltage VSS, that is, logical low. The driver 212 may operate in an open drain scheme. The driver 212 of the open drain scheme may be used when the power supply voltage VDD of the first electronic device 210 and the power supply voltage VDD of the second electronic device 220 are different.

A monitor circuit 213 may include a controller 230 and a first detector 240. The first detector 240 may perform an exclusive OR operation on the input signal IN and the output signal OUT. When the input signal IN and the output signal OUT are identical, the first detector 240 may activate a first check signal CHK1 to a low level. The controller 230 may activate the check signal CHK in response to the activation of the first check signal CHK1.

For example, the first detector 240 may be called a "first detection circuit" that checks logical correctness of the input signal IN and the output signal OUT to output the first check signal CHK1. For example, the controller 230 may activate the first detector 240 in the test mode and may deactivate the first detector 240 in the normal mode.

Figure 5:
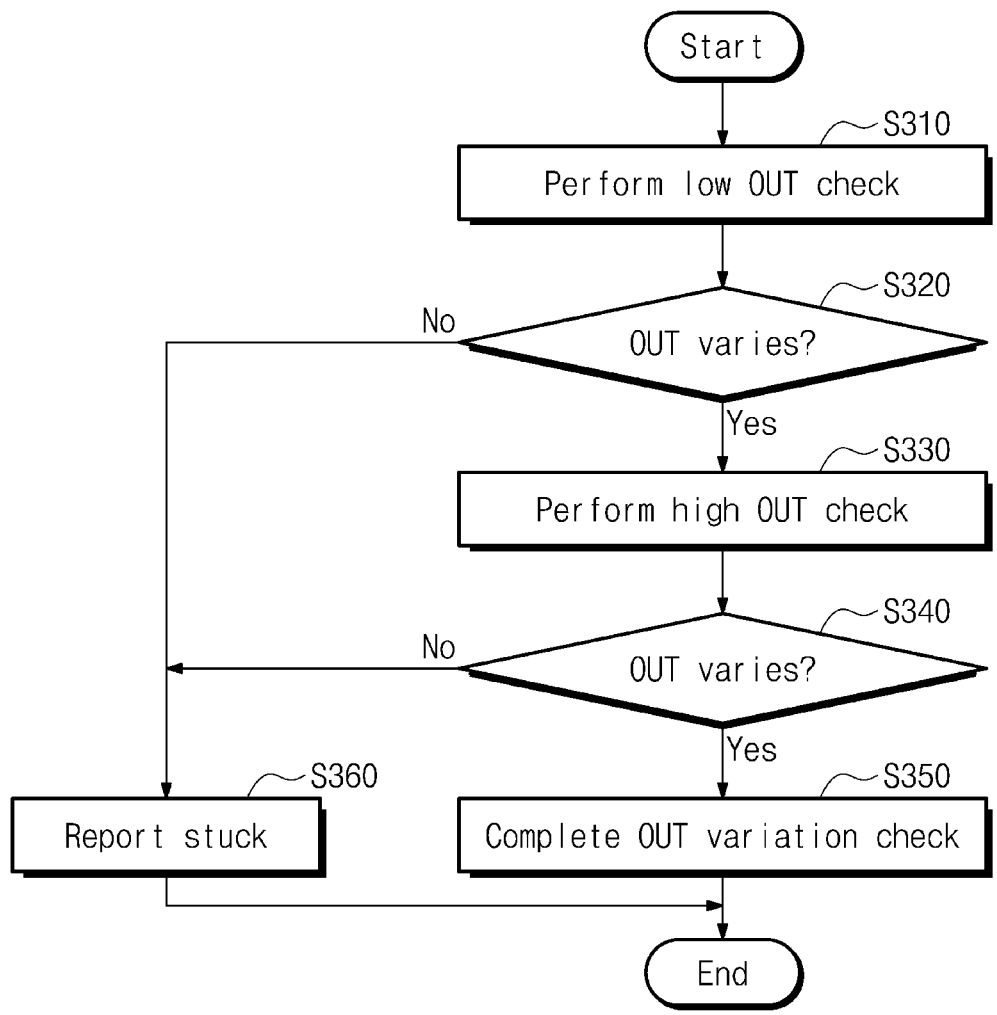
FIG. 5 is a flowchart for reference in describing an example in which a variation check of an output signal is performed.

FIG. 5 illustrates an example in which a variation check of the output signal OUT is performed. Referring to FIGS. 1 and 5, in operation S310, the monitor circuit 113 or 123 may perform a logical low check of the output signal OUT. Afterwards, the monitor circuit 113 or 123 may vary, for example, increase a level of the output signal OUT.

When it is determined in operation S320 that the output signal OUT varies, operation S330 may be performed. In operation S330, the monitor circuit 113 or 123 may perform a logical high check of the output signal OUT. The monitor circuit 113 or 123 may set the input signal IN such that the output signal OUT transitions to logical high, for example, may set the input signal IN to logical low. Afterwards, the monitor circuit 113 or 123 may vary, for example, decrease a level of the output signal OUT.

When it is determined in operation S340 that the output signal OUT varies, operation S350 may be performed. In operation S350, the monitor circuit 113 or 123 may complete the variation check of the output signal OUT.

When it is determined in operation S320 that the output signal OUT does not vary or when it is determined in operation S340 that the output signal OUT does not vary, in operation S360, the monitor circuit 113 or 123 may activate the check signal CHK to inform the core circuit 111 or 121 that the stuck voltage state is detected.

Figure 6:
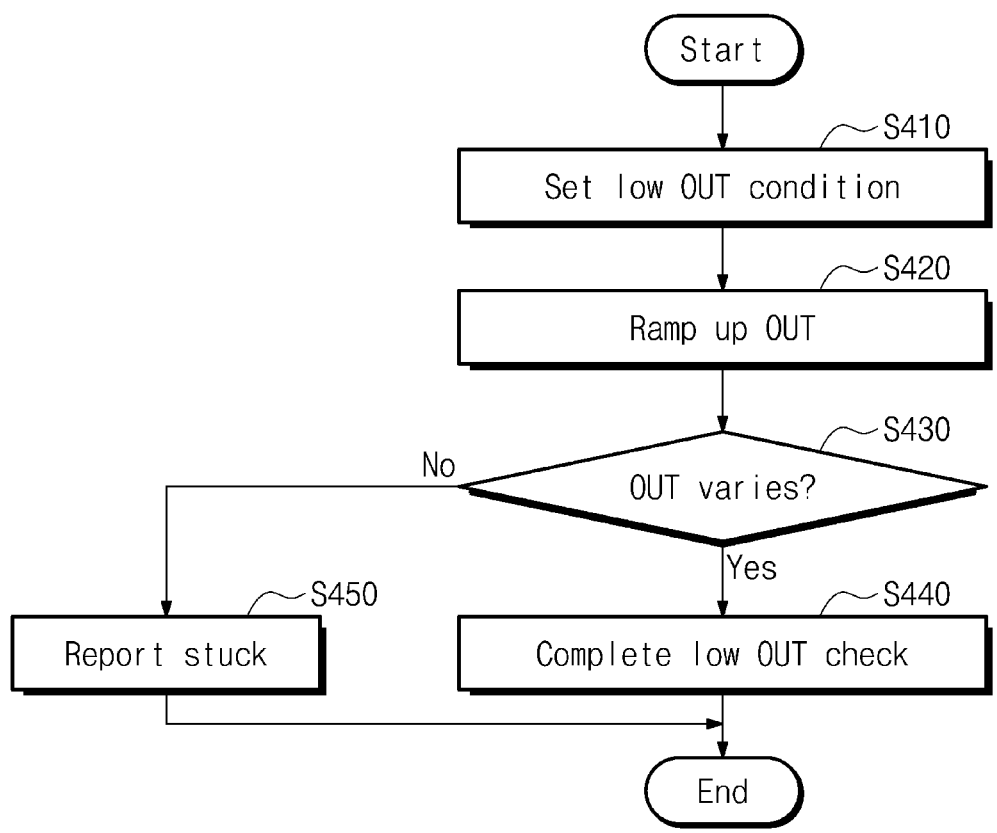
FIG. 6 is a flowchart for reference in describing an example in which a logical low check of an output signal is performed.

FIG. 6 illustrates an example in which a logical low check of the output signal OUT is performed. Referring to FIGS. 1 and 6, in operation S410, the monitor circuit 113 or 123 may set the input signal IN such that the output signal OUT transitions to logical low, for example, may set the input signal IN to logical high.

In operation S420, the monitor circuit 113 or 123 may ramp up the output signal OUT. For example, the monitor circuit 113 or 123 may ramp up the output signal OUT within a range where a logical level of the output signal OUT does not change.

In operation S430, the monitor circuit 113 or 123 may determine whether the output signal OUT varies. In response to that the output signal OUT varies, in operation S440, the monitor circuit 113 or 123 may complete the logical low check of the output signal OUT.

In response to that the output signal OUT does not vary, in operation S450, the monitor circuit 113 or 123 may activate the check signal CHK to inform the core circuit 111 or 121 that the stuck voltage state is detected. For example, the monitor circuit 113 or 123 may activate the check signal CHK in response to that the output signal OUT does not vary during a given time, for example, during a check time.

Figure 7:
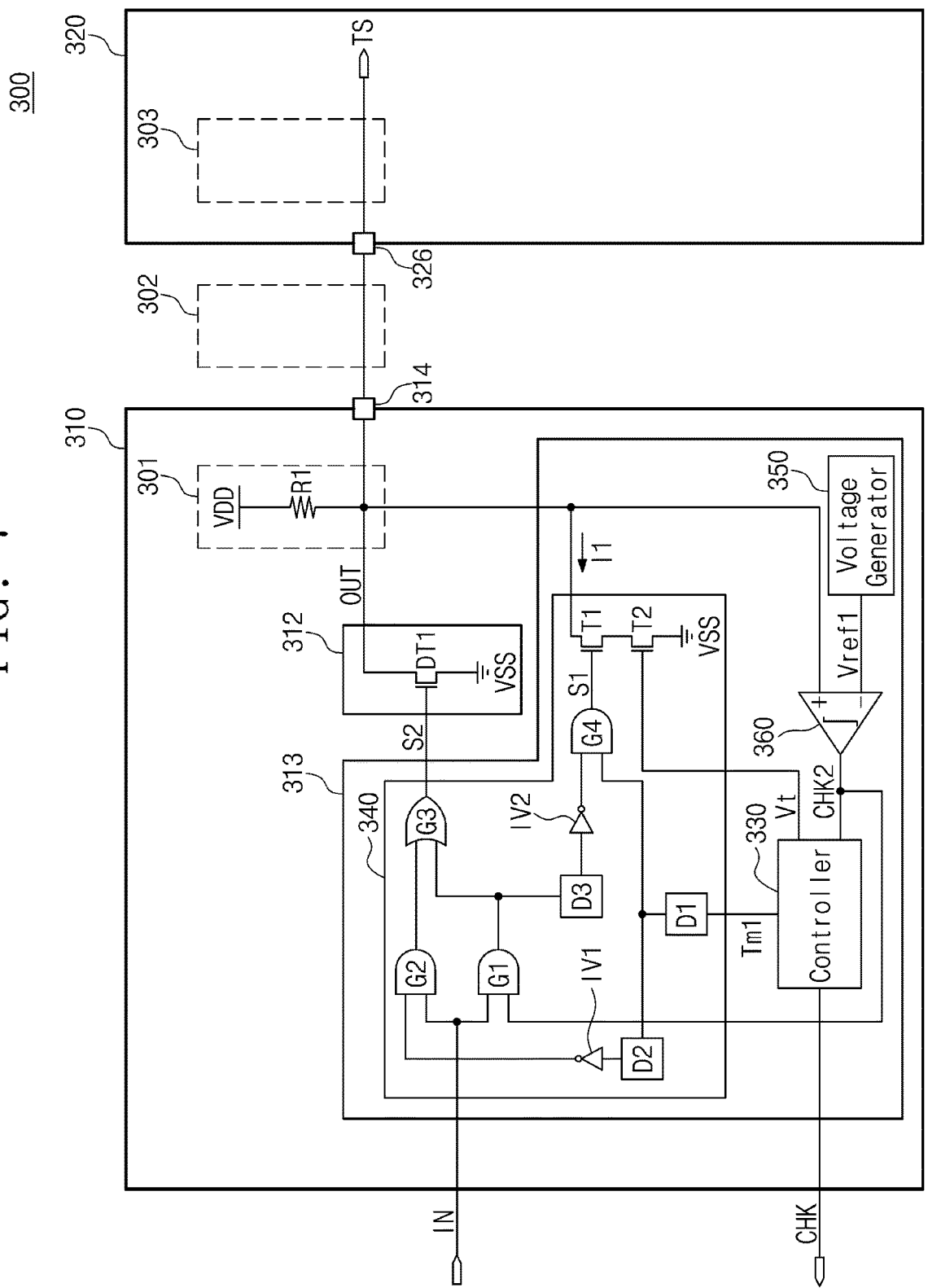
FIG. 7 illustrates a system including components for performing a logical low check of an output signal according to an embodiment of the inventive concept.

FIG. 7 illustrates a system 300 including components for performing a logical low check of the output signal OUT. Referring to FIGS. 1 and 7, the system 300 may include a first electronic device 310 and a second electronic device 320. A first pin 314 of the first electronic device 310 may be connected with a second pin 326 of the second electronic device 320. The first electronic device 310 and the second electronic device 320 may correspond to the first electronic device 110 and the second electronic device 120 of FIG. 1, respectively.

The first resistor R1 may be provided at one of a first location 301 being within the first electronic device 310, a second location 302 between the first electronic device 310 and the second electronic device 320, or a third location 303 being within the second electronic device 320. An example is illustrated as the first resistor R1 is provided at the first location 301.

A driver 312 may include the first drive transistor DT1. A second signal S2 may be applied to the gate of the first drive transistor DT1. In response to the second signal S2, the first drive transistor DT1 may selectively connect the output node, from which the output signal OUT is output, with the ground node to which the ground voltage VSS is applied.

A monitor circuit 313 may include a controller 330, a second detector 340, a reference voltage generator 350, and a comparator 360. The second detector 340, the reference voltage generator 350, and the comparator 360 may be called a "second detection circuit" that performs a logical low check of the output signal OUT to output a second check signal CHK2.

The second detector 340 may include a first gate G1, a second gate G2, a third gate G3, a fourth gate G4, a first transistor T1, a second transistor T2, a first inverter IV1, a second inverter IV2, a first delay unit D1, a second delay unit D2, and a third delay unit D3.

The first delay unit D1 may receive a first test signal Tm1. The first delay unit D1 may delay and output the first test signal Tm1. The second delay unit D2 may delay an output of the first delay unit D1 so as to be output to the first inverter IV1. The first inverter IV1 may invert and output an output of the second delay unit D2. The first gate G1 may perform an AND operation on the second check signal CHK2 and the input signal IN.

The third delay unit D3 may delay and output an output of the first gate G1. The second inverter IV2 may invert and output an output of the third delay unit D3. The second gate G2 may perform an AND operation on the input signal IN and an output of the first inverter IV1. The third gate G3 may perform an OR operation on the output of the first gate G1 and an output of the second gate G2. An output of the third gate G3 may be provided to the gate of the first drive transistor DT1 as the second signal S2.

The fourth gate G4 may perform an AND operation on the output of the first delay unit D1 and an output of the second inverter IV2. An output of the fourth gate G4 may be provided to a gate of the first transistor T1 as a first signal S1.

The first transistor T1 and the second transistor T2 may be serially connected between the output node of the output signal OUT and the ground node of the ground voltage VSS. A gate voltage Vt from the controller 330 may be provided to a gate of the second transistor T2.

The reference voltage generator 350 may generate a first reference voltage Vref1. The comparator 360 may compare the first reference voltage Vref1 and the output signal OUT. When a voltage of the output signal OUT is greater than the first reference voltage Vref1, the comparator 360 may activate the second check signal CHK2 to a high level. For example, the reference voltage generator 350 or the comparator 360 may be activated in the test mode and may be deactivated in the normal mode.

The controller 330 may apply the gate voltage Vt to the second transistor T2 in the test mode and may activate the first test signal Tm1. When the second check signal CHK2 transitions to the high level during the test time, the controller 330 may determine that the stuck voltage state is not detected. When the second check signal CHK2 does not transition to the high level during the test time, the controller 330 may determine that the stuck voltage state is detected. In response to that the second check signal CHK2 is not activated during the test time, the controller 330 may activate the check signal CHK to inform the core circuit 111 or 121 that the stuck voltage state is detected.

Figure 8:
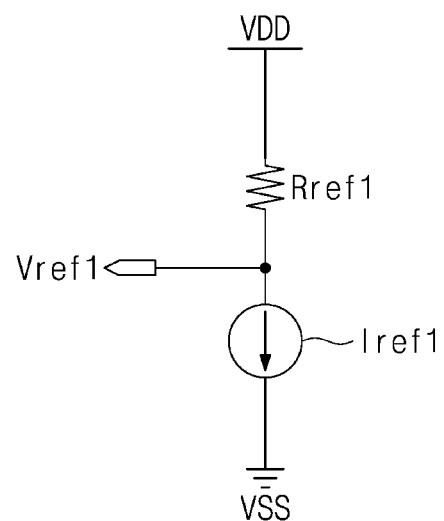
FIG. 8 illustrates an example of a reference voltage generator.

FIG. 8 illustrates an example of the reference voltage generator 350. Referring to FIGS. 1, 7, and 8, the reference voltage generator 350 may include a first reference resistor Rref1 and a first reference current source Iref1 connected in series between the power node of the power supply voltage VDD and the ground node of the ground voltage VSS. A voltage of a node between the first reference resistor Rref1 and the first reference current source Iref1 may be used as the first reference voltage Vref1.

When the first resistor R1 is provided at the first location 301 being within the first electronic device 310 as illustrated in FIG. 7, the reference voltage generator 350 may have the configuration illustrated in FIG. 8. The first resistor R1 and the first reference resistor Rref1 may be manufactured by the same process. A process variable of the first reference resistor Rref1 may cancel out a process variable applied to the first resistor R1. Accordingly, the first reference voltage Vref1 may be free from the process variable.

For example, when the first resistor R1 is provided at the second location 302 being outside the first electronic device 310, a bandgap reference voltage generator may be used as the reference voltage generator 350. The first reference voltage Vref1 may be a bandgap reference voltage or a voltage that is generated (e.g., is stepped up or stepped down) from the bandgap reference voltage.

For example, a switch that deactivates the reference voltage generator 350 in the normal mode such that power consumption is reduced may be added. The switch may be provided between the power node and the first reference resistor Rref1, between the first reference resistor Rref1 and the first reference current source Iref1, or between the first reference current source Iref1 and the ground node. The switch may be controlled by the first test signal Tm1.

Figure 9:
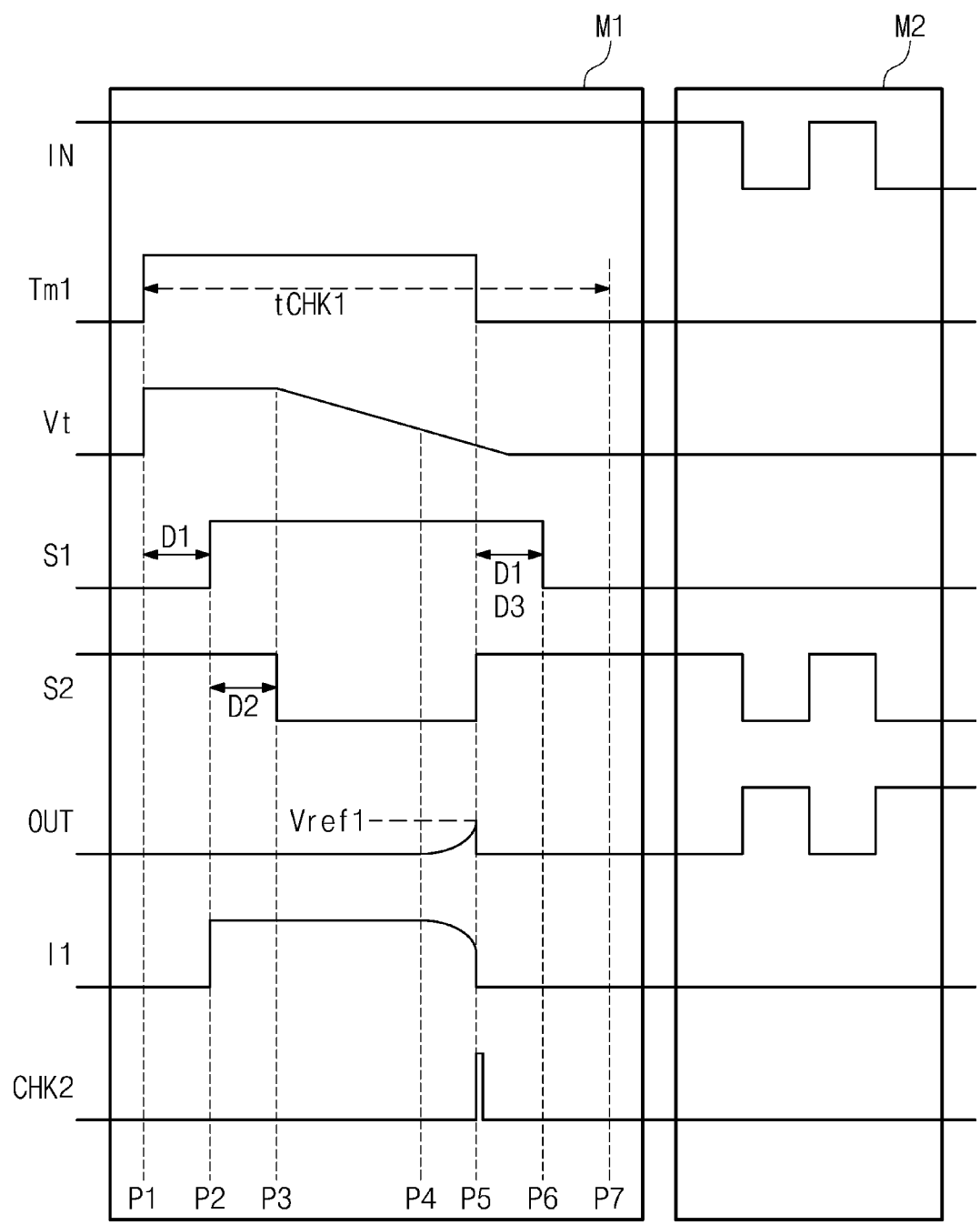
FIG. 9 is a timing diagram illustrating an example of signals of a monitor circuit of FIG. 7.

FIG. 9 is a timing diagram illustrating signals of the monitor circuit 313 of FIG. 7. Referring to FIGS. 1, 7, and 9, at a first phase P1, the controller 330 may enter a first mode M1 being the test mode. The controller 330 may activate the first test signal Tm1 to the high level. For the logical low check of the output signal OUT, the input signal IN may be set to the high level. The controller 330 may control the gate voltage Vt to a turn-on level at an early stage of the first mode M1. The turn-on level may be a level enough to turn on the second transistor T2.

At the early stage of the first mode M1, the input signal IN may be at the high level, and the second check signal CHK2 may be at the low level. Accordingly, the output of the first gate G1 may be at the low level, and the output of the second inverter IV2 may be at the high level. As the first test signal Tm1 transitions to the high level, the output of the first delay unit D1 may be set to the high level after a delay of the first delay unit D1. Accordingly, in a second phase P2, as all inputs of the fourth gate G4 are set to the high level, the first signal S1 may be set to the high level.

The first transistor T1 is turned on by the first signal S1, and the second transistor T2 is turned on by the gate voltage Vt. Accordingly, the output node of the output signal OUT may be connected with the ground node through the first transistor T1 and the second transistor T2, and the output signal OUT maintains a ground level.

After the output of the first delay unit D1 transitions to the high level and a delay of the second delay unit D2 passes, the output of the second delay unit D2 may transition to the high level. The output of the first inverter IV1 is set to the low level, and the output of the second gate G2 is set to the low level. Because the output of the first gate G1 and the output of the second gate G2 are set to the low level, in a third phase P3, the second signal S2 being the output of the third gate G3 is set to the low level. Accordingly, the first drive transistor DT1 is turned off.

From the first phase P1 to the third phase P3, the controller 330 may perform the turn-on of the first transistor T1 and the second transistor T2 prior to the turn-off of the first drive transistor DTI, thus preventing the logical level of the output signal OUT from changing. The controller 330 may turn off the first drive transistor DT1 and may connect the first transistor T1 and the second transistor T2 with the output node for the purpose of checking the output signal OUT.

After the first drive transistor DT1 is turned off, the controller 330 may gradually decrease a level of the gate voltage Vt. As the gate voltage Vt decreases, in a fourth phase P4, the amount of first current I1 may decrease. As the amount of first current I1 decreases, a level of the output signal OUT may increase due to the power node connected with the first resistor R1.

When a voltage of the output signal OUT reaches the first reference voltage Vref1, in a fifth phase P5, the comparator 360 may activate the second check signal CHK2 to the high level. As the second check signal CHK2 transitions to the high level, the output of the first gate G1 may be set to the high level, and the second signal S2 being the output of the third gate G3 transition to the high level. Accordingly, the first drive transistor DT1 is turned on, and the output signal OUT decreases to the ground voltage VSS.

When the second check signal CHK2 transitions to the high level, the controller 330 may set the first test signal Tm1 to the low level. After the first test signal Tm1 is set to the low level and the delay of the first delay unit D1 passes, in a sixth phase P6, the first signal S1 being the output of the fourth gate G4 transitions to the low level. Alternatively, after the output of the first gate G1 transition to the high level and the delay of the third delay unit D3 passes, in the sixth phase P6, the first signal S1 being the output of the fourth gate G4 transitions to the low level. Accordingly, the first transistor T1 is turned off.

In the case where the output signal OUT is stuck to the ground node, even though the amount of first current I1 decreases in the fourth phase P4 and the fifth phase P5, the level of the output signal OUT may not increase and may be maintained at the ground voltage VSS. When the second check signal CHK2 does not transition to the high level during a first check time tCHK1, the controller 330 may activate the check signal CHK to report the stuck voltage state.

After the first check time tCHK1 passes, in a seventh phase P7, the controller 330 may complete the logical low check of the output signal OUT. For example, in response to that the second check signal CHK2 is set to the high level, the controller 330 may early complete the logical low check of the sixth phase P6.

The controller 330 may further perform any other check or may enter a second mode M2 being the normal mode. In the second mode M2 being the normal mode, the input signal IN may toggle between the high level and the low level. Because the first test signal Tm1 is at the low level, the output of the first inverter IV1 may be at the high level. When the input signal IN is at the high level, the output of the second gate G2 may be at the high level; when the input signal IN is at the low level, the output of the second gate G2 may be at the low level.

Likewise, when the output of the second gate G2 is at the high level, the second signal S2 may be at the high level; when the output of the second gate G2 is at the low level, the second signal S2 may be at the low level. In the second mode M2, the second signal S2 may follow the input signal IN. Accordingly, the first drive transistor DT1 may operate in response to the input signal IN.

Figure 10:
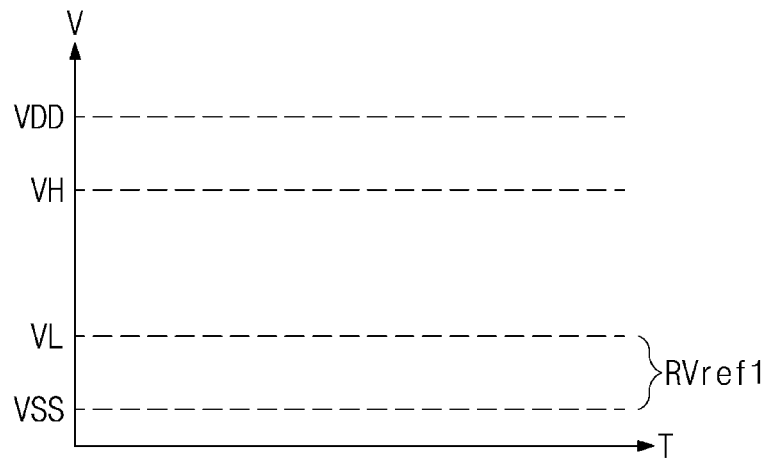
FIG. 10 illustrates an example of a range of a first reference voltage.

FIG. 10 illustrates an example of a range of the first reference voltage Vref1. In FIG. 10, a horizontal axis represents a time "T", and a vertical axis represents a voltage "V". Referring to FIGS. 1, 7, and 10, a low voltage VL may be the highest level that the receiver 115 or 125 of the first or second electronic device 110 or 120 identifies as the low level. When a voltage of the transmit signal TS is equal to or smaller than the low voltage VL, the receiver 115 or 125 may determine that the transmit signal TS is at the low level.

A high voltage VH may be the lowest level that the receiver 115 or 125 identifies as the high level. When a voltage of the transmit signal TS is equal to or greater than the high voltage VH, the receiver 115 or 125 may determine that the transmit signal TS is at the high level.

The first reference voltage Vref1 may be defined within a range from the ground voltage VSS to the low voltage VL. Accordingly, even though the monitor circuit 113 or 123 of one of the first and second electronic devices 110 or 120 performs a check while varying the output signal OUT, the receiver 125 or 115 of the other electronic device 120 or 110 does not sense a change in the transmit signal TS. That is, according to an embodiment of the inventive concept, the monitoring of the output signal OUT does not influence the communication between the first electronic device 110 and the second electronic device 120.

Figure 11:
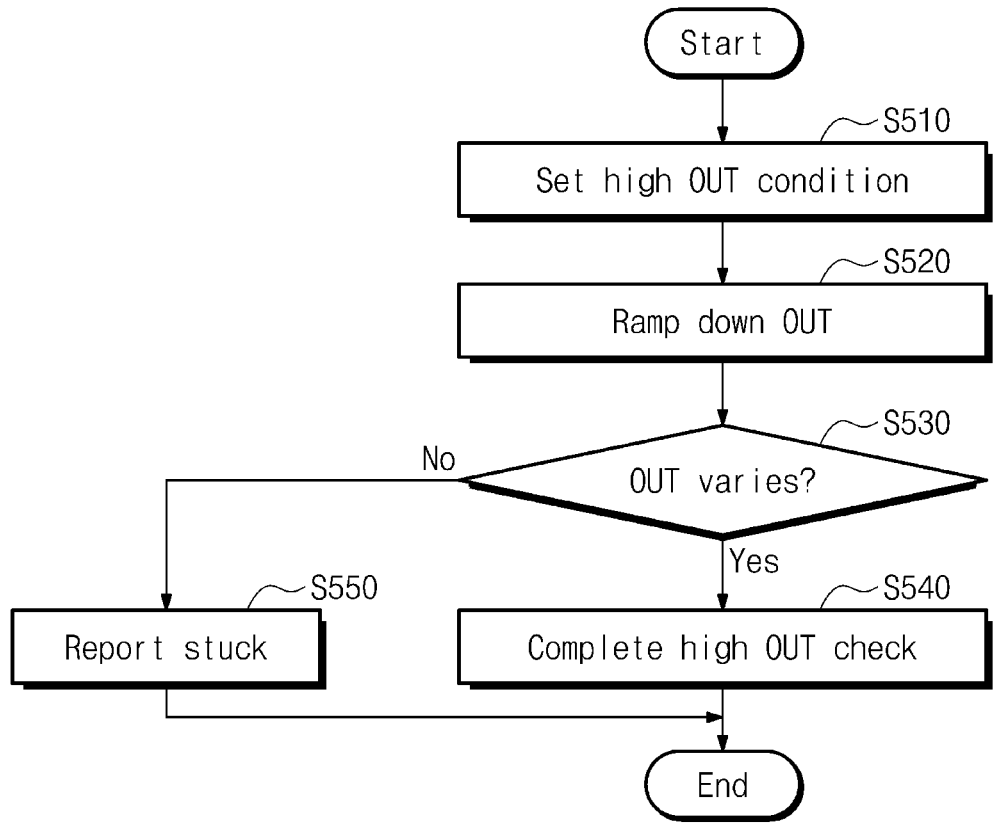
FIG. 11 is a flowchart for reference in describing an example in which a logical high check of an output signal is performed.

FIG. 11 illustrates an example in which a logical high check of the output signal OUT is performed. Referring to FIGS. 1 and 11, in operation S510, the monitor circuit 113 or 123 may set the input signal IN such that the output signal OUT transitions to logical high, for example, may set the input signal IN to logical low.

In operation S520, the monitor circuit 113 or 123 may ramp down the output signal OUT. For example, the monitor circuit 113 or 123 may ramp down the output signal OUT within a range where a logical level of the output signal OUT does not change.

In operation S530, the monitor circuit 113 or 123 may determine whether the output signal OUT varies. In response to that the output signal OUT varies, in operation S540, the monitor circuit 113 or 123 may complete the logical high check of the output signal OUT.

In response to that the output signal OUT does not vary, in operation S550, the monitor circuit 113 or 123 may activate the check signal CHK to inform the core circuit 111 or 121 that the stuck voltage state is detected. For example, the monitor circuit 113 or 123 may activate the check signal CHK in response to that the output signal OUT does not vary during a given time, for example, during a check time.

Figure 12:
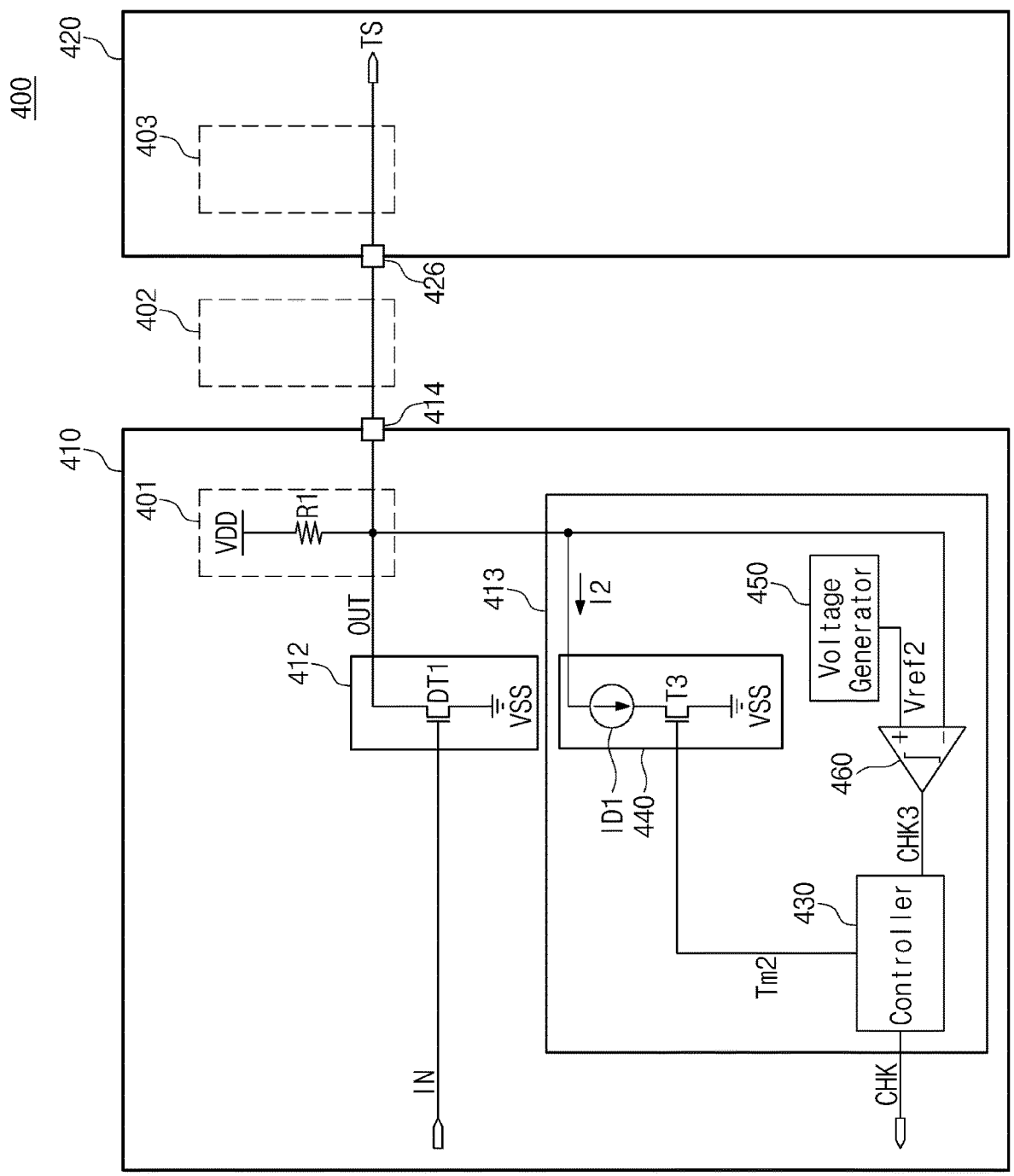
FIG. 12 illustrates a system including components for performing a logical high check of an output signal according to an embodiment of the inventive concept.

FIG. 12 illustrates a system 400 including components for performing a logical high check of the output signal OUT. Referring to FIGS. 1 and 12, the system 400 may include a first electronic device 410 and a second electronic device 420. A first pin 414 of the first electronic device 410 may be connected with a second pin 426 of the second electronic device 420. The first electronic device 410 and the second electronic device 420 may correspond to the first electronic device 110 and the second electronic device 120 of FIG. 1, respectively.

The first resistor R1 may be provided at one of a first location 401 being within the first electronic device 410, a second location 402 between the first electronic device 410 and the second electronic device 420, or a third location 403 being within the second electronic device 420. An example is illustrated as the first resistor R1 is provided at the first location 401.

A driver 412 may include the first drive transistor DT1. The input signal IN may be applied to a gate of the first drive transistor DT1. In response to the input signal IN, the first drive transistor DT1 may selectively connect the output node, from which the output signal OUT is output, with the ground node to which the ground voltage VSS is applied.

A monitor circuit 413 may include a controller 430, a third detector 440, a reference voltage generator 450, and a comparator 460. The third detector 440, the reference voltage generator 450, and the comparator 460 may be called a "third detection circuit" that performs a logical high check of the output signal OUT to output a third check signal CHK3.

The third detector 440 may include a first current source ID1 and a third transistor T3 that are connected in series between the output node of the output signal OUT and the ground node of the ground voltage VSS. A second test signal Tm2 from the controller 430 may be applied to a gate of the third transistor T3. The first current source ID1 may be a variable current source that varies a current amount under control of the controller 430.

The reference voltage generator 450 may generate a second reference voltage Vref2. The reference voltage generator 450 may be implemented to have the configuration described with reference to FIG. 8. For example, the reference voltage generator 450 may generate a second reference voltage Vref2 by using a second reference resistor Rref2 and a second reference current source Iref2 instead of the first reference resistor Rref1 and the first reference current source Iref1.

The comparator 460 may compare the second reference voltage Vref2 and the output signal OUT. When a voltage of the output signal OUT is smaller than the second reference voltage Vref2, the comparator 460 may activate the third check signal CHK3 to the high level. For example, the reference voltage generator 450 or the comparator 460 may be activated in the test mode and may be deactivated in the normal mode.

The controller 430 may activate the second test signal Tm2 in the test mode. When the third check signal CHK3 transitions to the high level during the test time, the controller 430 may determine that the stuck voltage state is not detected. When the third check signal CHK3 does not transition to the high level during the test time, the controller 430 may determine that the stuck voltage state is detected. In response to that the third check signal CHK3 is not activated during the test time, the controller 430 may activate the check signal CHK to inform the core circuit 111 or 121 that the stuck voltage state is detected.

Figure 13:
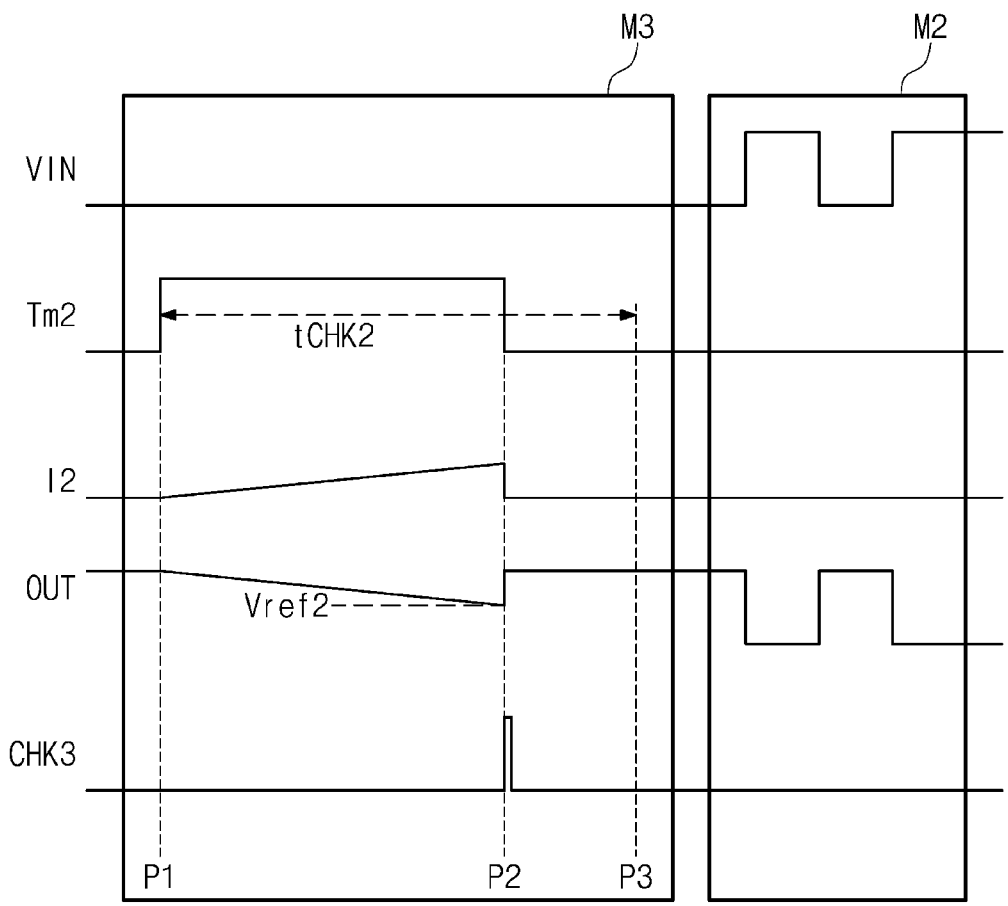
FIG. 13 is a timing diagram illustrating an example of signals of a monitor circuit of FIG. 12.

FIG. 13 is a timing diagram illustrating signals of the monitor circuit 413 of FIG. 12. Referring to FIGS. 1, 12, and 13, at a first phase P1, the controller 430 may enter a third mode M3 being the test mode. The controller 430 may activate the second test signal Tm2 to the high level. For the logical high check of the output signal OUT, the input signal IN may be set to the low level.

As the second test signal Tm2 transitions to the high level, the third transistor T3 may be turned on. The controller 430 may gradually increase a current amount of the first current source ID1. As a current amount of the first current source ID1 gradually increases, the amount of second current I2 may gradually increase. As the amount of second current I2 gradually increases, a level of the output signal OUT may gradually decrease.

When a voltage of the output signal OUT reaches the second reference voltage Vref2, in a second phase P2, the comparator 460 may deactivate the first current source ID1 and may activate the third check signal CHK3 to the high level. When the third check signal CHK3 transitions to the high level, the controller 430 may deactivate the second test signal Tm2 to the low level. Accordingly, the output signal OUT may increase to the power supply voltage VDD.

In the case where the output signal OUT is stuck to the power node, even though the amount of second current I2 increases in the first phase P1 and the second phase P2, the level of the output signal OUT may not decrease and may be maintained at the power supply voltage VDD. When the third check signal CHK3 does not transition to the high level during a second check time tCHK2, the controller 430 may activate the check signal CHK to report the stuck voltage state.

After the second check time tCHK2 passes, in a third phase P3, the controller 430 may complete the logical high check of the output signal OUT. For example, in response to that the third check signal CHK3 is set to the high level, the controller 430 may early complete the logical high check of the second phase P2.

The controller 430 may further perform any other check or may enter the second mode M2 being the normal mode. In the second mode M2 being the normal mode, the input signal IN may toggle between the high level and the low level. In the second mode M2, the first drive transistor DT1 may drive the output signal OUT in response to the input signal IN.

Figure 14:
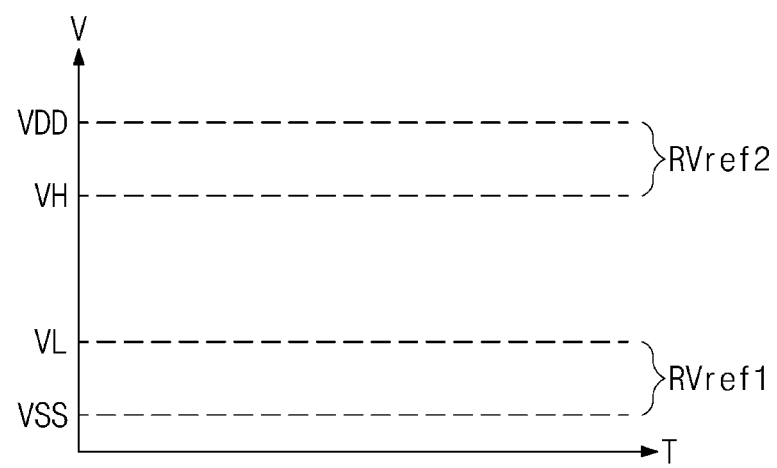
FIG. 14 illustrates an example of a range of a second reference voltage.

FIG. 14 illustrates an example of a range of the second reference voltage Vref2. In FIG. 14, a horizontal axis represents a time "T", and a vertical axis represents a voltage "V". Referring to FIGS. 1, 12, and 14, the second reference voltage Vref2 may be defined within a range from the power supply voltage VDD to the high voltage VH. Accordingly, even though the monitor circuit 113 or 123 of one electronic device 110 or 120 performs a check while varying the output signal OUT, the receiver 125 or 115 of the other electronic device 120 or 110 does not sense a change in the transmit signal TS. That is, according to an embodiment of the inventive concept, the monitoring of the output signal OUT does not influence the communication between the first electronic device 110 and the second electronic device 120.

Figure 15:
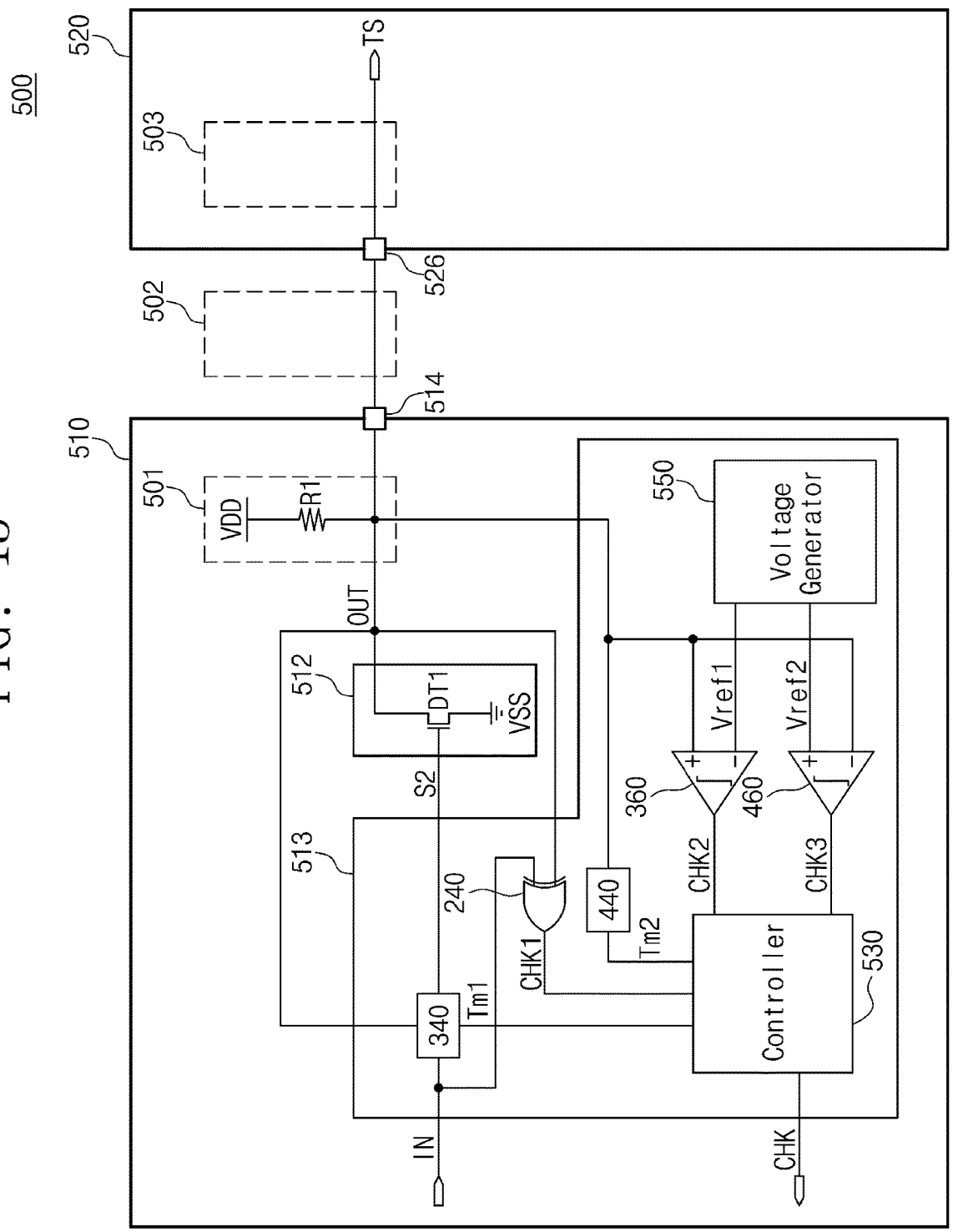
FIG. 15 illustrates a system including components for performing a logical check, and a logical low check and a logical high check of an output signal according to an embodiment of the inventive concept.

FIG. 15 illustrates a system 500 including components for performing a logical check, and a logical low check and a logical high check of the output signal OUT. Referring to FIGS. 1 and 15, the system 500 may include a first electronic device 510 and a second electronic device 520. A first pin 514 of the first electronic device 510 may be connected with a second pin 526 of the second electronic device 520. The first electronic device 510 and the second electronic device 520 may correspond to the first electronic device 110 and the second electronic device 120 of FIG. 1, respectively.

The first resistor R1 may be provided at one of a first location 501 being within the first electronic device 510, a second location 502 between the first electronic device 510 and the second electronic device 520, or a third location 503 being within the second electronic device 520. An example is illustrated as the first resistor R1 is provided at the first location 501.

A driver 512 may include the first drive transistor DT1. The second signal S2 from the monitor circuit 513 may be applied to a gate of the first drive transistor DT1. In response to the second signal S2, the first drive transistor DT1 may selectively connect the output node, from which the output signal OUT is output, with the ground node to which the ground voltage VSS is applied.

A monitor circuit 513 may include the first detector 240 performing the logical check, the second detector 340 performing the logical low check of the output signal OUT, and the third detector 440 performing the logical high check of the output signal OUT.

The first detector 240 may perform an exclusive OR operation on the input signal IN and the output signal OUT. The first detector 240 may provide the first check signal CHK1 to a controller 530. When the first check signal CHK1 is at the low level, the controller 530 may determine that the input signal IN and the output signal OUT are logically incorrect.

The second detector 340 may receive the input signal IN and the first test signal Tm1, may output the second signal S2, and may be connected with the output node of the output signal OUT. A configuration and an operation of the second detector 340 are identical to those described with reference to FIGS. 6 to 10. The third detector 440 may receive the second test signal Tm2 and may be connected with the output node of the output signal OUT. A configuration and an operation of the third detector 440 are identical to those described with reference to FIGS. 11 to 14.

A reference voltage generator 550 may output the first reference voltage Vref1 and the second reference voltage Vref2. A first comparator TDI may compare the first reference voltage Vref1 and the output signal OUT and may output a comparison result as the second check signal CHK2. A second comparator 460 may compare the second reference voltage Vref2 and the output signal OUT and may output a comparison result as the third check signal CHK3.

The controller 530 may detect the stuck voltage state based on the first check signal CHK1, the second check signal CHK2, and the third check signal CHK3. When the stuck voltage state is detected, the controller 530 may activate the check signal CHK to inform the core circuit 111 or 121 that the stuck voltage state is detected.

Figure 16:
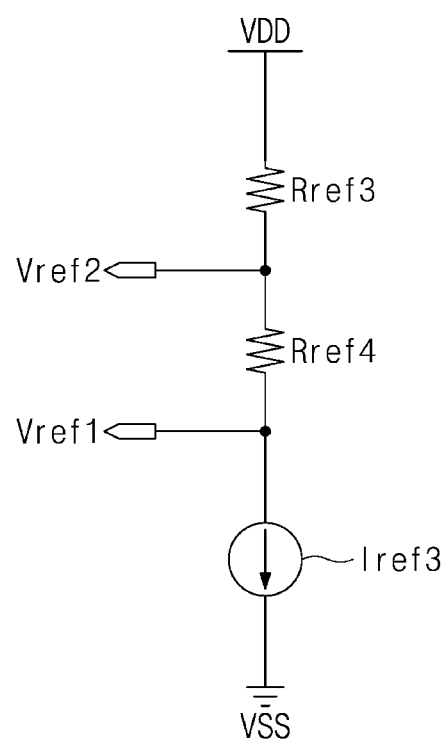
FIG. 16 illustrates an example of a reference voltage generator.

FIG. 16 illustrates an example of the reference voltage generator 550. Referring to FIGS. 1, 15, and 16, the reference voltage generator 550 may include a third reference resistor Rref3, a fourth reference resistor Rref4, and a third reference current source Iref3 connected in series between the power node of the power supply voltage VDD and the ground node of the ground voltage VSS.

A voltage of a node between the third reference resistor Rref3 and the fourth reference resistor Rref4 may be used as the second reference voltage Vref2. A voltage of a node between the fourth reference resistor Rref4 and the third reference current source Iref3 may be used as the first reference voltage Vref1.

For example, when the first resistor R1 is provided at the first location 501 being within the first electronic device 310 as illustrated in FIG. 7, the reference voltage generator 550 may have the configuration illustrated in FIG. 16. The first resistor R1, the third reference resistor Rref3, and the fourth reference resistor Rref4 may be manufactured by the same process. A process variable of the third reference resistor Rref3 and the fourth reference resistor Rref4 may cancel out a process variable applied to the first resistor R1. Accordingly, the first reference voltage Vref1 and the second reference voltage Vref2 may be free from the process variable.

For example, when the first resistor R1 is provided at the second location 502 being outside the first electronic device 510, a bandgap reference voltage generator may be used as the reference voltage generator 550. The first reference voltage Vref1 and the second reference voltage Vref2 may be bandgap reference voltages or voltages that are generated (e.g., are stepped up or stepped down) from the bandgap reference voltages.

For example, a switch that deactivates the reference voltage generator 550 in the normal mode such that power consumption is reduced may be added. The switch may be provided between the power node and the third reference resistor Rref3, between the third reference resistor Rref3 and the fourth reference resistor Rref4, between the fourth reference resistor Rref4 and the third reference current source Iref3, or between the third reference current source Iref3 and the ground node. The switch may be activated by the controller 530 in the test mode.

Figure 17:
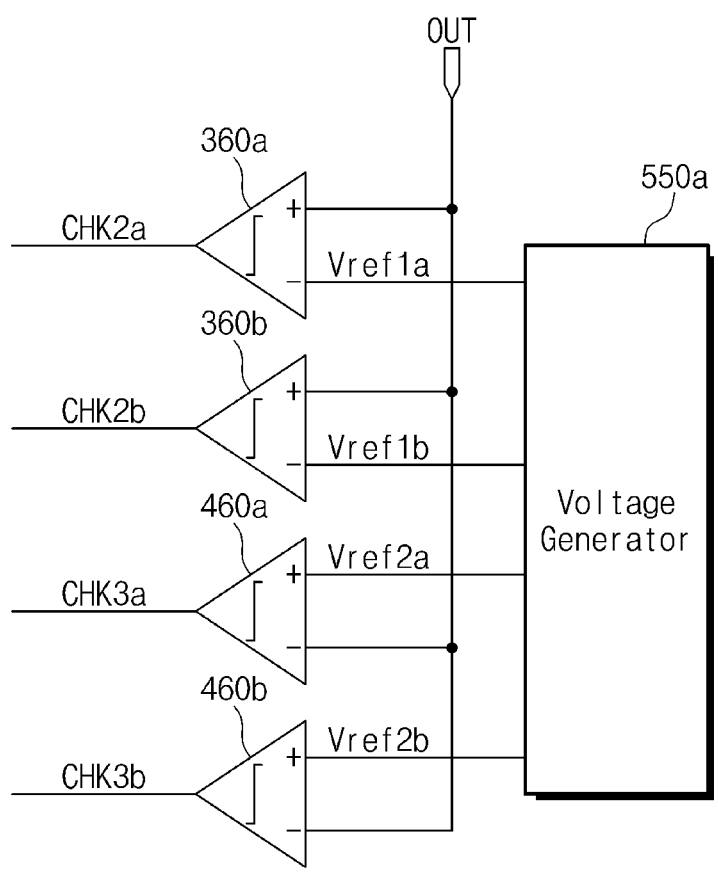
FIG. 17 illustrates an example in which multiple comparators are used for a variation check of an output signal.

FIG. 17 illustrates an example in which a plurality of comparators 360a, 360b, 460a, and 460b are used for the variation check of the output signal OUT. The voltage generator 550 and the comparators 360 and 460 may be replaced with a voltage generator 550a and the comparators 360a, 360b, 460a, and 460b of FIG. 17.

Referring to FIGS. 1, 15, and 17, the 1a-th comparator 360a may compare a 1a-th reference voltage Vref1a and the output signal OUT. When a voltage of the output signal OUT is greater than the 1a-th reference voltage Vref1a, the 1a-th comparator 360a may activate a 2a-th check signal CHK2a to the high level. A 1b-th comparator 360b may compare a 1b-th reference voltage Vref1b and the output signal OUT. When a voltage of the output signal OUT is greater than the 1bb-th reference voltage Vref1b, the 2b-th comparator 360b may activate a 2b-th check signal CHK2b to the high level.

The 1a-th comparator 360a may be used to perform the logical low check of the output signal OUT. When the 2a-th check signal CHK2a is maintained at the low level during a specific check time in the test mode, the controller 530 may detect the stuck voltage state and may activate the check signal CHK to the logical high.

The 1b-th comparator 360b may be used to determine a level of the output signal OUT. When the output signal OUT is at the low level in the test mode, the 1b-th comparator 360b may compare a level of the output signal OUT with a level of the 1b-th reference voltage Vref1b. For example, the 1b-th reference voltage Vref1b may be smaller or greater than the 1a-th reference voltage Vref1a. Two or more comparators and two or more different reference voltages may be used to determine a voltage of the low level of the output signal OUT.

When a voltage of the output signal OUT is greater than a 2a-th reference voltage Vref2a, a 2a-th comparator 460a may activate a 3a-th check signal CHK3a to the high level. A 2b-th comparator 460b may compare a 2b-th reference voltage Vref2b and the output signal OUT. When a voltage of the output signal OUT is greater than the 2b-th reference voltage Vref2b, the 2b-th comparator 460b may activate a 3b-th check signal CHK3b to the high level.

The 2a-th comparator 460a may be used to perform the logical high check of the output signal OUT. When the 3a-th check signal CHK3a is maintained at the low level during a specific check time in the test mode, the controller 530 may detect the stuck voltage state and may activate the check signal CHK to the logical high.

The 2b-th comparator 460b may be used to determine a level of the output signal OUT. When the output signal OUT is at the high level in the test mode, the 2b-th comparator 460b may compare a level of the output signal OUT with a level of the 2b-th reference voltage Vref2b. For example, the 2b-th reference voltage Vref2b may be smaller or greater than the 2a-th reference voltage Vref2a. Two or more comparators and two or more different reference voltages may be used to determine a voltage of the high level of the output signal OUT.

The number of reference voltages that the voltage generator 550a generates may increase by increasing the number of reference resistors as illustrated in FIG. 16.

Figure 18:
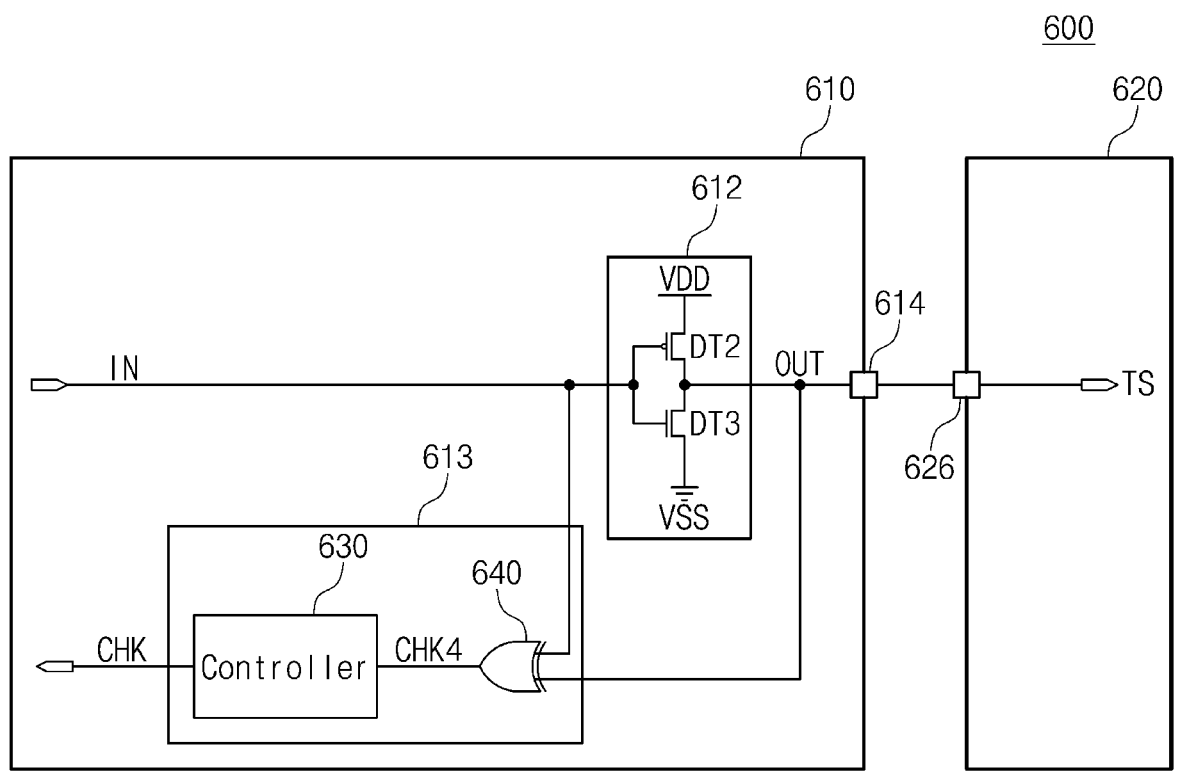
FIG. 18 illustrates a system including components for performing a logical check according to an embodiment of the inventive concept.

FIG. 18 illustrates a system 600 including components for performing a logical check. Referring to FIGS. 1 and 18, the system 600 may include a first electronic device 610 and a second electronic device 620. A first pin 614 of the first electronic device 610 may be connected with a second pin 626 of the second electronic device 620. The first electronic device 610 and the second electronic device 620 may correspond to the first electronic device 110 and the second electronic device 120 of FIG. 1, respectively.

A driver 612 may include a second drive transistor DT2 and a third drive transistor DT3 that are connected in series between the power node of the power supply voltage VDD and the ground node of the ground voltage VSS. The input signal IN may be applied to gates of the second and third drive transistors DT2 and DT3. A voltage of a node between the second drive transistor DT2 and the third drive transistor DT3 may be an output voltage. The second drive transistor DT2 and the third drive transistor DT3 may constitute an inverter. When the input signal IN is at the high level, the driver 612 may connect the output node of the output signal OUT with the ground node by using the third drive transistor DT3. When the input signal IN is at the low level, the driver 612 may connect the output node of the output signal OUT with the power node by using the second drive transistor DT2.

A monitor circuit 613 may include a controller 630 and a fourth detector 640. The fourth detector 640 may perform an exclusive OR operation on the input signal IN and the output signal OUT. When the input signal IN and the output signal OUT are identical, the fourth detector 640 may activate a fourth check signal CHK4 to the low level. The controller 630 may activate the check signal CHK in response to the activation of the fourth check signal CHK4.

For example, the fourth detector 640 may be called a "first detection circuit" that checks logical correctness of the input signal IN and the output signal OUT to output the fourth check signal CHK4. For example, the controller 630 may activate the fourth detector 640 in the test mode and may deactivate the fourth detector 640 in the normal mode.

Figure 19:
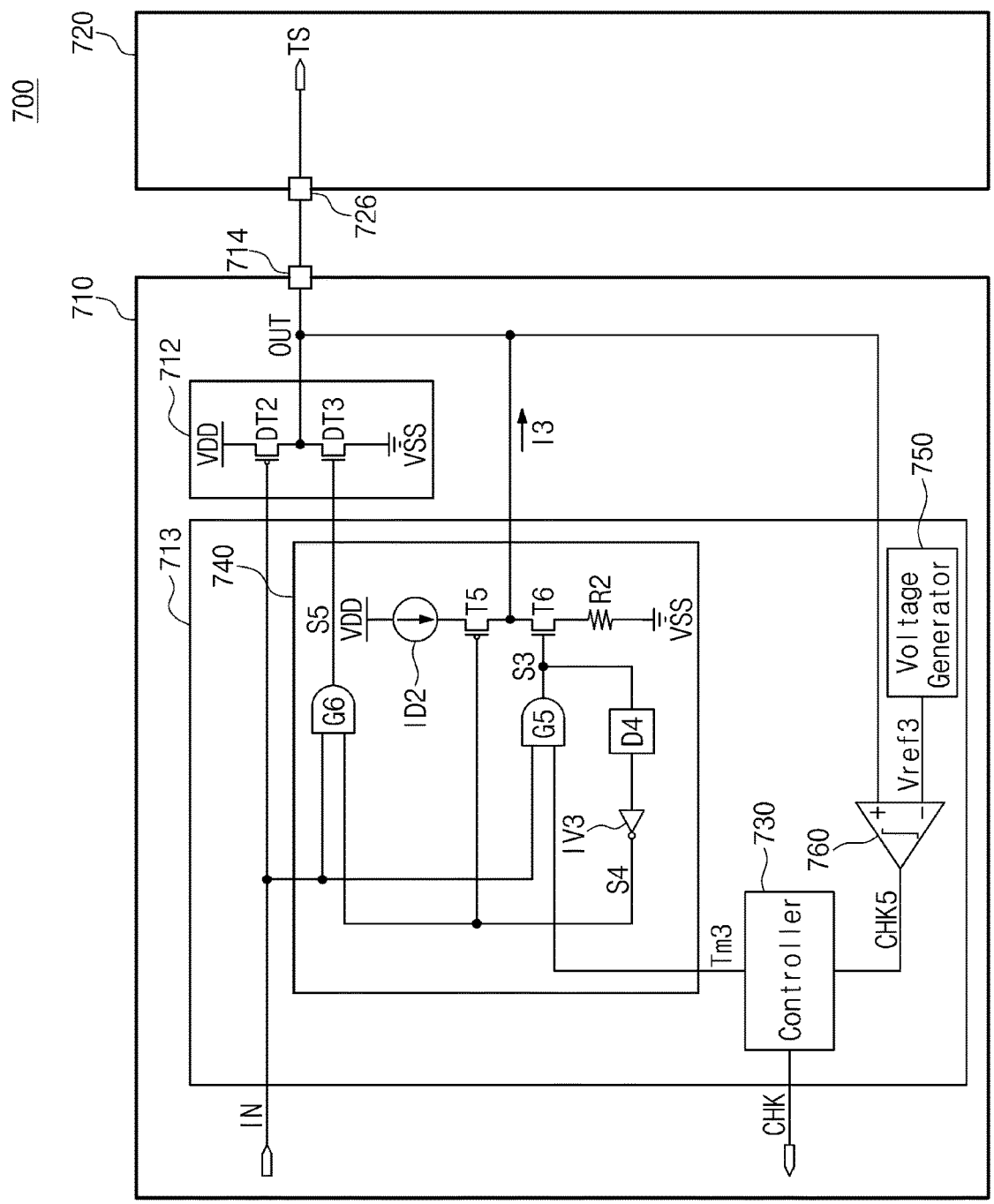
FIG. 19 illustrates a system including components for performing a logical low check of an output signal according to an embodiment of the inventive concept.

FIG. 19 illustrates a system 700 including components for performing a logical low check of the output signal OUT. Referring to FIGS. 1 and 19, the system 700 may include a first electronic device 710 and a second electronic device 720. A first pin 714 of the first electronic device 710 may be connected with a second pin 726 of the second electronic device 720. The first electronic device 710 and the second electronic device 720 may correspond to the first electronic device 110 and the second electronic device 120 of FIG. 1, respectively.

A driver 712 may include the second drive transistor DT2 and the third drive transistor DT3. The input signal IN may be applied to the gate of the second drive transistor DT2, and an output of a sixth gate G6 may be applied to the gate of the third drive transistor DT3.

A monitor circuit 713 may include a controller 730, a fifth detector 740, a reference voltage generator 750, and a comparator 760. The fifth detector 740, the reference voltage generator 750, and the comparator 760 may be called a "second detection circuit" that performs a logical low check of the output signal OUT to output a fifth check signal CHK5.

The fifth detector 740 may include a fifth gate G5, the sixth gate G6, a fourth delay unit D4, a third inverter IV3, a fifth transistor T5, a sixth transistor T6, a second resistor R2, and a second current source ID2. The second current source ID2 may be a variable current source that varies a current amount under control of the controller 730.

The fifth gate G5 may calculate an AND value of the input signal IN and a third test signal Tm3 from the controller 730. The fifth gate G5 may output a result of the calculation as a third signal S3. The third signal S3 is applied to a gate of the sixth transistor T6. The fourth delay unit D4 may invert and output the third signal S3. The third inverter IV3 may invert an output of the fourth delay unit D4 to output a fourth signal S4.

The fourth signal S4 may be applied to a gate of the fifth transistor T5. The sixth gate G6 may calculate an AND value of the fourth signal S4 and the input signal IN. An output of the sixth gate G6 may be provided to the gate of the third drive transistor DT3 as a fifth signal S5.

A node between the fifth transistor T5 and the sixth transistor T6 may be connected between the output node of the output signal OUT. The second current source ID2 may be connected between the power supply voltage VDD and the fifth transistor T5. The second resistor R2 may be connected between the sixth transistor T6 and the ground node.

The reference voltage generator 750 may generate a third reference voltage Vref3. The comparator 760 may compare the third reference voltage Vref3 and the output signal OUT. When a voltage of the output signal OUT is greater than the third reference voltage Vref3, the comparator 760 may activate the fifth check signal CHK5 to the high level. For example, the reference voltage generator 750 or the comparator 760 may be activated in the test mode and may be deactivated in the normal mode.

The controller 730 may activate the third test signal Tm3 in the test mode. When the fifth check signal CHK5 transitions to the high level during a test time, the controller 730 may determine that the stuck voltage state is not detected. When the fifth check signal CHK5 does not transition to the high level during the test time, the controller 730 may determine that the stuck voltage state is detected. In response to that the fifth check signal CHK5 is not activated during the test time, the controller 730 may activate the check signal CHK to inform the core circuit 111 or 121 that the stuck voltage state is detected.

Figure 20:
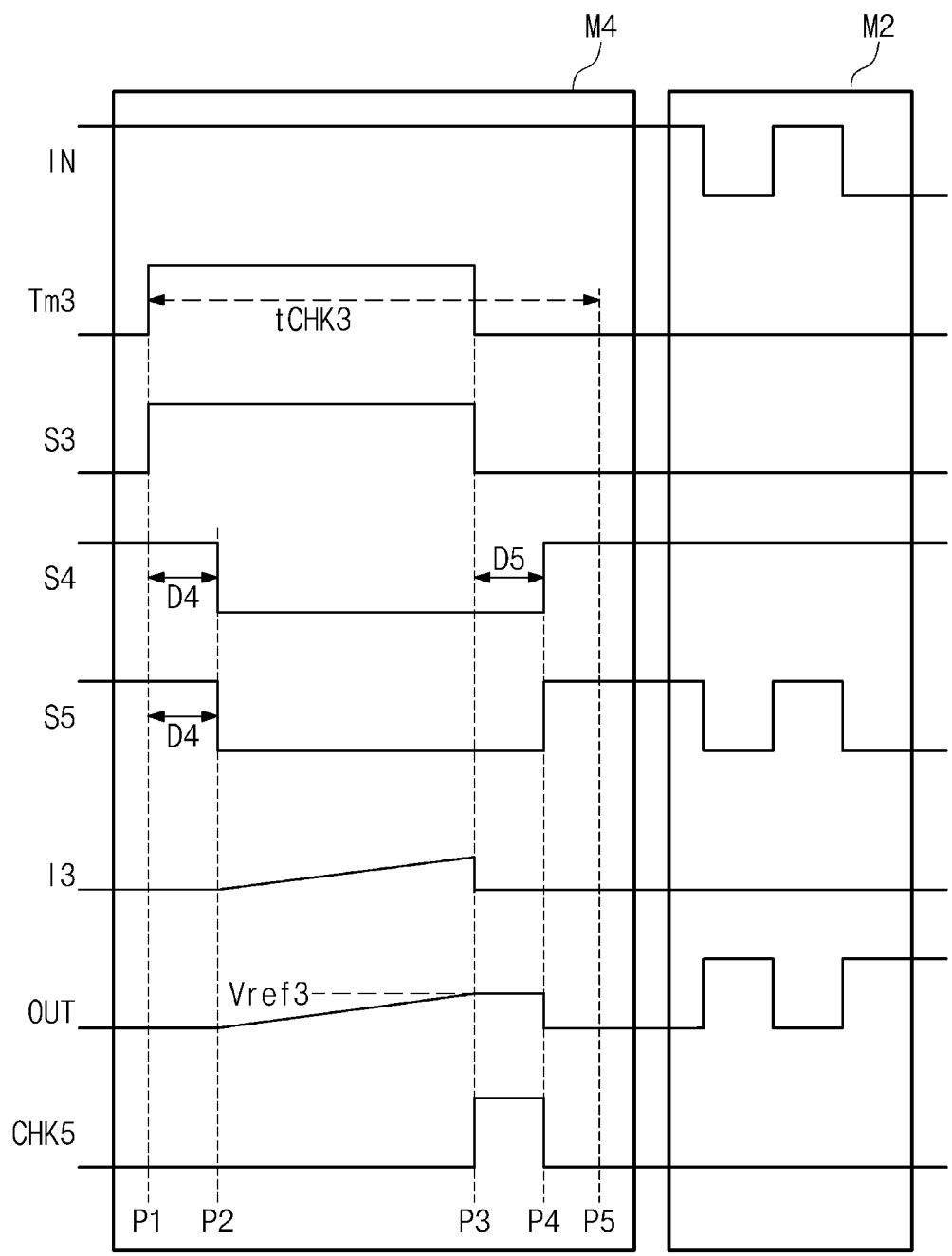
FIG. 20 is a timing diagram illustrating an example of signals of a monitor circuit of FIG. 19.

FIG. 20 is a timing diagram illustrating signals of the monitor circuit 713 of FIG. 19. Referring to FIGS. 1, 19, and 20, at a first phase P1, the controller 730 may enter a fourth mode M4 being the test mode. The controller 730 may activate the third test signal Tm3 to the high level. For the logical low check of the output signal OUT, the input signal IN may be set to the high level.

In the first phase P1, the input signal IN may be at the high level, and the third test signal Tm3 may be at the high level. Accordingly, the output of the fifth gate G5 transitions to the high level, and the sixth transistor T6 is turned on. The sixth transistor T6 may connect the output node with the ground node.

After a delay time of the fourth delay unit D4 passes, in a second phase P2, the fourth signal S4 may transition to the low level. As the fourth signal S4 transitions to the low level, the fifth transistor T5 may be turned on. The fifth signal S5 may transition to the low level, and the third drive transistor DT3 is turned off. That is, the driver 712 is deactivated.

The controller 730 may gradually increase a current amount of the second current source ID2. As the current amount of the second current source ID2 gradually increases, the amount of third current I3 may gradually increase. As the amount of third current I3 gradually increases, a voltage of the output signal OUT may gradually increase.

When a voltage of the output signal OUT reaches the third reference voltage Vref3, in a third phase P3, the comparator 760 may activate the fifth check signal CHK5 to the high level. When the fifth check signal CHK5 transitions to the high level, the controller 730 may set the third test signal Tm3 to the low level. When the third test signal Tm3 is set to the low level, the controller 730 may deactivate the second current source ID2. Accordingly, the output node of the output signal OUT may be set to the ground voltage VSS through the sixth transistor T6. The third signal S3 transitions to the low level, and the sixth transistor T6 is turned off.

After a delay of the fifth delay unit D5, in a fourth phase P4, the fourth signal S4 may transition to the high level. Accordingly, the fifth transistor T5 is turned off. The fifth signal S5 transitions to the high level, and the third drive transistor DT3 is turned on. That is, the driver 712 is activated.

In the case where the output signal OUT is stuck to the ground node, even though the amount of third current I3 increases in the second phase P2 and the third phase P3, the level of the output signal OUT may not increase and may be maintained at the ground voltage VSS. When the fifth check signal CHK5 does not transition to the high level during a third check time tCHK3, the controller 730 may activate the check signal CHK to report the stuck voltage state.

After the third check time tCHK3 passes, in a fifth phase P5, the controller 730 may complete the logical low check of the output signal OUT. For example, in response to that the fifth check signal CHK5 is set to the high level, the controller 730 may early complete the logical low check of the output signal OUT in the fourth phase P4.

The controller 730 may further perform any other check or may enter the second mode M2 being the normal mode. In the second mode M2 being the normal mode, the input signal IN may toggle between the high level and the low level. Because the third test signal Tm3 is at the low level, the fourth signal S4 may be at the high level. When the input signal IN is at the high level, the fifth signal S5 may be at the high level; when the input signal IN is at the low level, the fifth signal S5 may be at the low level. In the second mode M2, the fifth signal S5 may follow the input signal IN. Accordingly, the second drive transistor DT2 and the third drive transistor DT3 may operate in response to the input signal IN.

Figure 21:
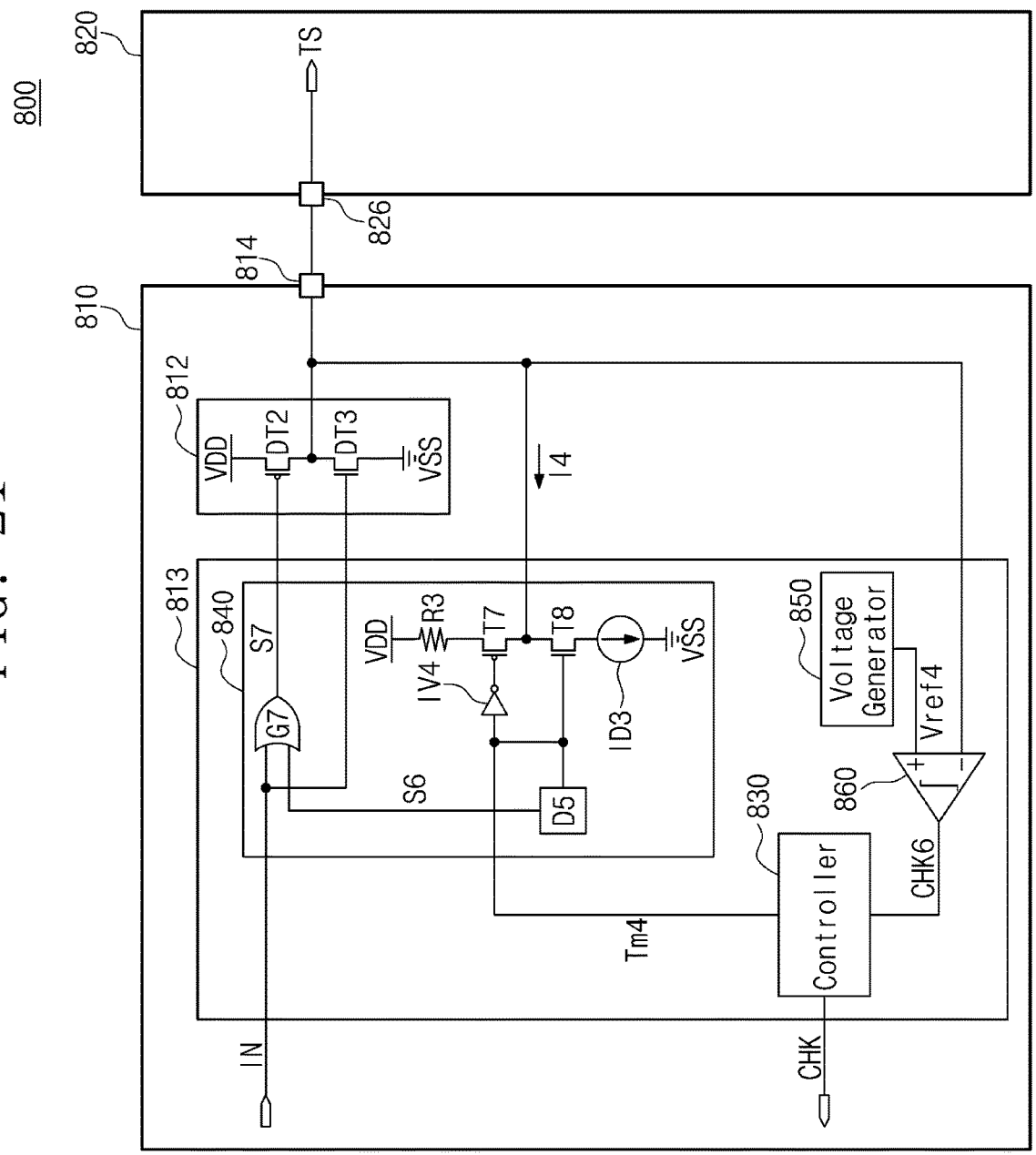
FIG. 21 illustrates a system including components for performing a logical high check of an output signal according to an embodiment of the inventive concept.

FIG. 21 illustrates a system 800 including components for performing a logical high check of the output signal OUT. Referring to FIGS. 1 and 21, the system 800 may include a first electronic device 810 and a second electronic device 820. A first pin 814 of the first electronic device 810 may be connected with a second pin 826 of the second electronic device 820. The first electronic device 810 and the second electronic device 820 may correspond to the first electronic device 110 and the second electronic device 120 of FIG. 1, respectively.

A driver 812 may include the second drive transistor DT2 and the third drive transistor DT3. A seventh signal S7 being an output of a seventh gate G7 may be applied to the gate of the second drive transistor DT2, and the input signal IN may be applied to the gate of the third drive transistor DT3.

A monitor circuit 813 may include a controller 830, a sixth detector 840, a reference voltage generator 850, and a comparator 860. The sixth detector 840, the reference voltage generator 850, and the comparator 860 may be called a "third detection circuit" that performs a logical high check of the output signal OUT to output a sixth check signal CHK6.

The sixth detector 840 may include the seventh gate G7, a fifth delay unit D5, a fourth inverter IV4, a seventh transistor T7, an eighth transistor T8, a third resistor R3, and a third current source ID3. The third current source ID3 may be a variable current source that varies a current amount under control of the controller 830.

A fourth test signal Tm4 from the controller 830 may be applied to a gate of the eighth transistor T8. The fourth inverter IV4 may invert the fourth test signal Tm4 from the controller 830 and may output the inverted version of the fourth test signal Tm4 to a gate of the seventh transistor T7. A node between the seventh transistor T7 and the eighth transistor T8 may be connected with the output node of the output signal OUT.

The third resistor R3 may be connected between the seventh transistor T7 and the power node. The third current source ID3 may be connected between the eighth transistor T8 and the ground node. The fifth delay unit D5 may delay the fourth test signal Tm4 and may output the fourth test signal Tm4 thus delayed as a sixth signal S6. The seventh gate G7 may output a seventh signal S7 as a result of performing an OR operation on the input signal IN and the sixth signal S6. The seventh signal S7 may be applied to a gate of the second drive transistor DT2.

The reference voltage generator 850 may generate a fourth reference voltage Vref4. The comparator 860 may compare the fourth reference voltage Vref4 and the output signal OUT. When a voltage of the output signal OUT is smaller than the fourth reference voltage Vref4, the comparator 860 may activate the sixth check signal CHK6 to the high level. For example, the reference voltage generator 850 or the comparator 860 may be activated in the test mode and may be deactivated in the normal mode.

The controller 830 may activate the fourth test signal Tm4 in the test mode. When the sixth check signal CHK6 transitions to the high level during a test time, the controller 830 may determine that the stuck voltage state is not detected. When the sixth check signal CHK6 does not transition to the high level during the test time, the controller 830 may determine that the stuck voltage state is detected. In response to that the sixth check signal CHK6 is not activated during the test time, the controller 830 may activate the check signal CHK to inform the core circuit 111 or 121 that the stuck voltage state is detected.

Figure 22:
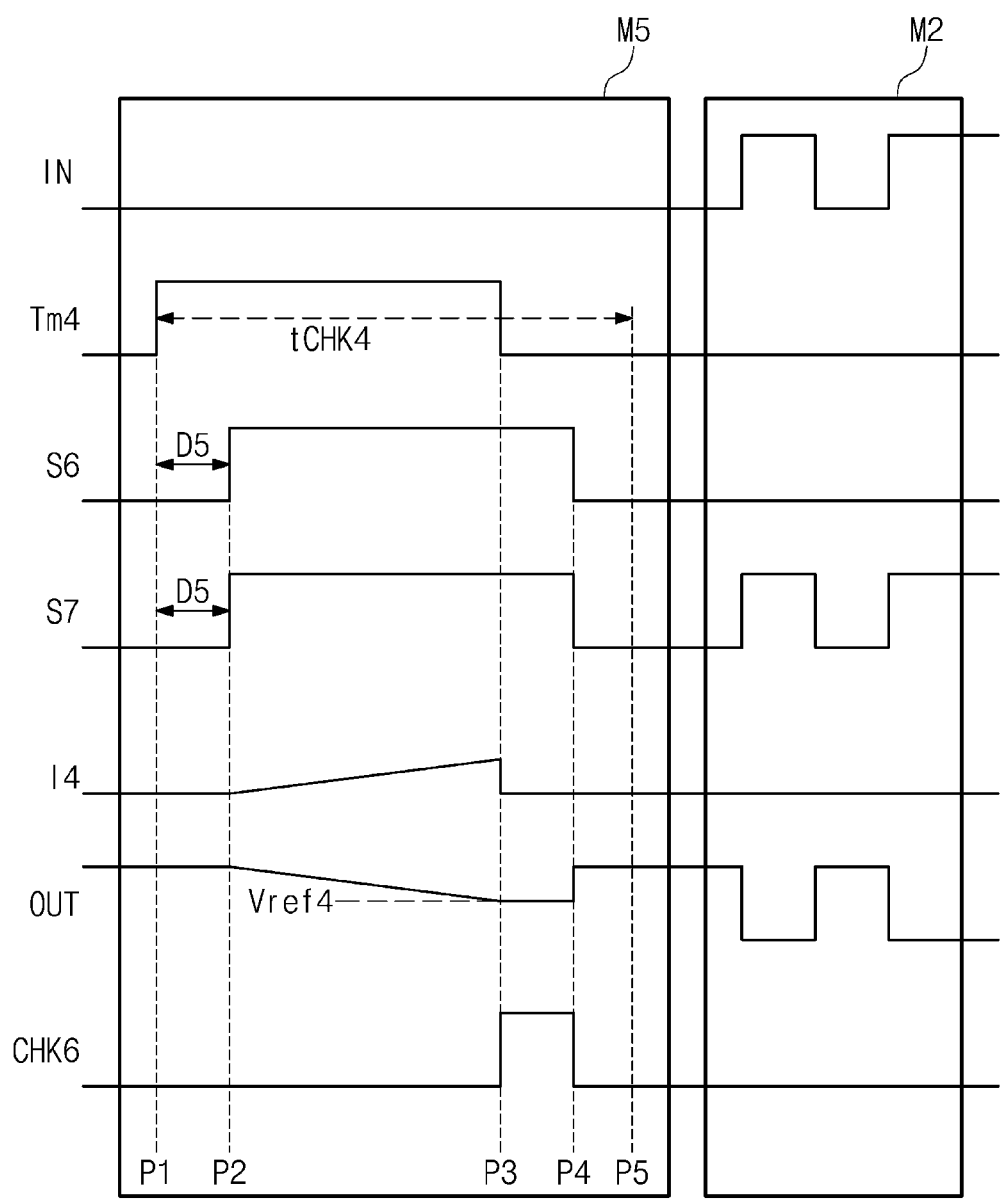
FIG. 22 is a timing diagram illustrating an example of signals of a monitor circuit of FIG. 21.

FIG. 22 is a timing diagram illustrating signals of the monitor circuit 813 of FIG. 21. Referring to FIGS. 1, 21, and 22, at a first phase P1, the controller 830 may enter a fifth mode M5 being the test mode. The controller 830 may activate the fourth test signal Tm4 to the high level. For the logical high check of the output signal OUT, the input signal IN may be set to the low level.

As the fourth test signal Tm4 transitions to the high level, the seventh transistor T7 and the eighth transistor T8 are turned on. The seventh transistor T7 may supply the power supply voltage VDD to the output node of the output signal OUT. The eighth transistor T8 may connect the third current source ID3 with the output node.

After a delay time of the fifth delay unit D5 passes, in a second phase P2, the sixth signal S6 transitions to the high level. Accordingly, the seventh signal S7 is set to the high level. The second drive transistor DT2 and the third drive transistor DT3 are turned off, and the driver 812 is deactivated. The controller 830 may gradually increase a current amount of the third current source ID3. As the current amount of the third current source ID3 gradually increases, the amount of fourth current I4 may gradually increase. As the amount of fourth current I4 gradually increases, a level of the output signal OUT may gradually decrease.

When a voltage of the output signal OUT reaches the fourth reference voltage Vref4, in a third phase P3, the comparator 860 may activate the sixth check signal CHK6 to the high level. When the sixth check signal CHK6 transitions to the high level, the controller 830 may deactivate third current source ID3 and may deactivate the fourth test signal Tm4 to the low level. As the fourth test signal Tm4 is set to the low level, the seventh transistor T7 and the eighth transistor T8 are turned off.

After the delay time of the fifth delay unit D5 passes, in a fourth phase P4, the sixth signal S6 transitions to the low level, and the seventh signal S7 transitions to the low level. As the seventh signal S7 transitions to the low level, the third drive transistor DT3 is turned on. That is, the driver 812 may be activated.

In the case where the output signal OUT is stuck to the power node, even though the amount of fourth current I4 increases in the second phase P2 and the third phase P3, the level of the output signal OUT may not decrease and may be maintained at the power supply voltage VDD. When the sixth check signal CHK6 does not transition to the high level during a fourth check time tCHK4, the controller 830 may activate the check signal CHK to report the stuck voltage state.

After the fourth check time tCHK4 passes, in a fifth phase P5, the controller 830 may complete the logical high check of the output signal OUT. For example, in response to that the sixth check signal CHK6 is set to the high level, the controller 830 may early complete the logical high check of the output signal OUT in the fourth phase P4.

The controller 830 may further perform any other check or may enter the second mode M2 being the normal mode. In the second mode M2 being the normal mode, the input signal IN may toggle between the high level and the low level. In the second mode M2, the seventh signal S7 may follow the input signal IN. Accordingly, the second drive transistor DT2 and the third drive transistor DT3 may drive the output signal OUT in response to the input signal IN.

Figure 23:
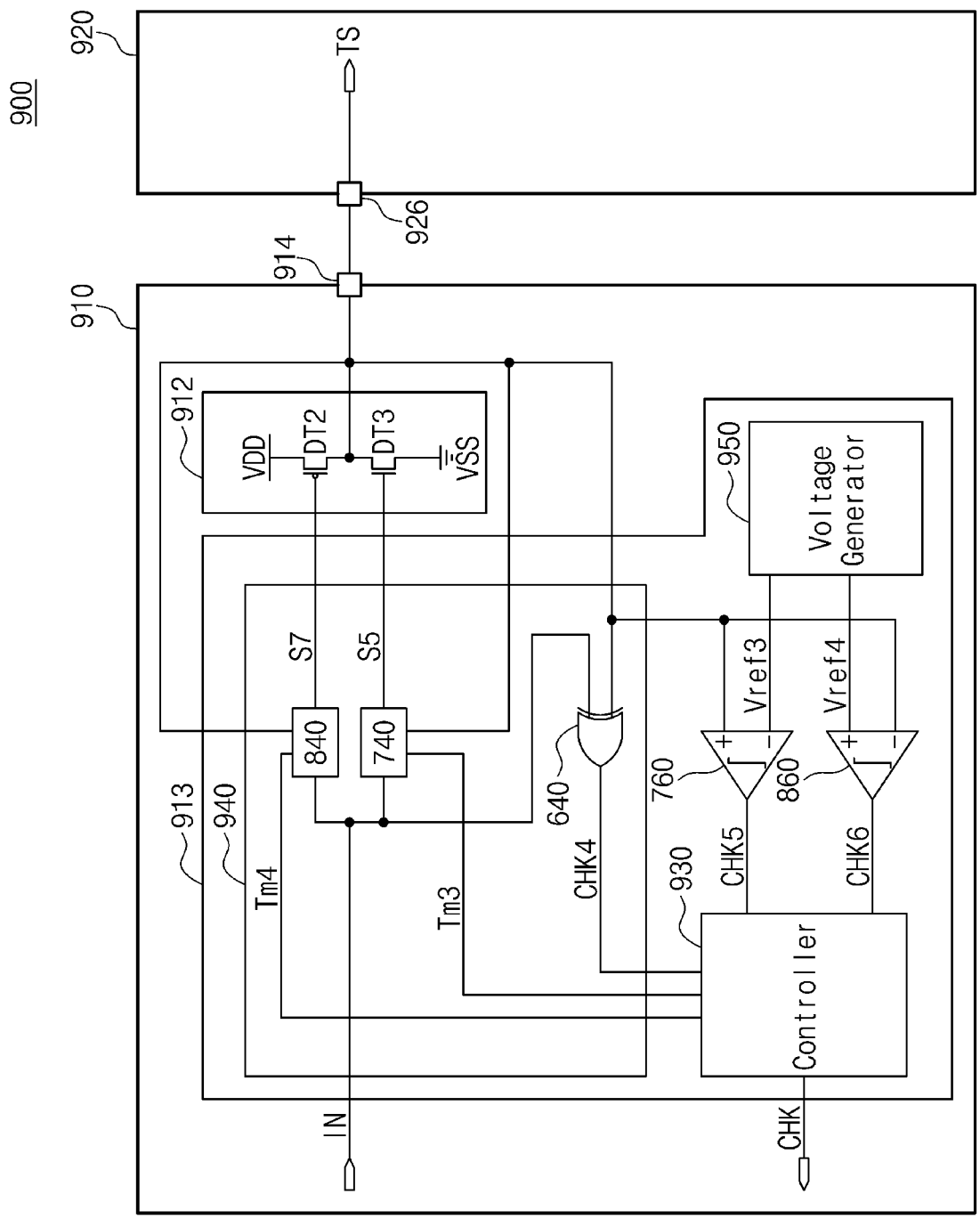
FIG. 23 illustrates a system including components for performing a logical check, and a logical low check and a logical high check of an output signal according to an embodiment of the inventive concept.

FIG. 23 illustrates a system 900 including components for performing a logical check, and a logical low check and a logical high check of the output signal OUT. Referring to FIGS. 1 and 23, the system 900 may include a first electronic device 910 and a second electronic device 920. A first pin 914 of the first electronic device 910 may be connected with a second pin 926 of the second electronic device 920. The first electronic device 910 and the second electronic device 920 may correspond to the first electronic device 110 and the second electronic device 120 of FIG. 1, respectively.

A driver 912 may include the second drive transistor DT2 and the third drive transistor DT3. The fifth signal S5 being an output of the fifth detector 740 may be applied to the gate of the third drive transistor DT3, and the seventh signal S7 being an output of the sixth detector 840 may be applied to the gate of the second drive transistor DT2.

A monitor circuit 913 may include the fourth detector 640 performing the logical check, the fifth detector 740 performing the logical low check of the output signal OUT, and the sixth detector 840 performing the logical high check of the output signal OUT.

The fourth detector 640 may perform an exclusive OR operation on the input signal IN and the output signal OUT. The fourth detector 640 may provide the fourth check signal CHK4 to a controller 930. When the fourth check signal CHK4 is at the low level, the controller 930 may determine that the input signal IN and the output signal OUT are logically incorrect.

The fifth detector 740 may receive the input signal IN and the third test signal Tm3, may output the fifth signal S5, and may be connected with the output node of the output signal OUT. A configuration and an operation of the fifth detector 740 are identical to those described with reference to FIGS. 19 and 20. The sixth detector 840 may receive the fourth test signal Tm4, may output the seventh signal S7, and may be connected with the output node of the output signal OUT. A configuration and an operation of the sixth detector 840 are identical to those described with reference to FIGS. 21 and 22.

A reference voltage generator 950 may output the third reference voltage Vref3 and the fourth reference voltage Vref4. The first comparator 760 may compare the third reference voltage Vref3 and the output signal OUT and may output a comparison result as the fifth check signal CHK5. The second comparator 860 may compare the fourth reference voltage Vref4 and the output signal OUT and may output a comparison result as the sixth check signal CHK6.

The controller 930 may detect the stuck voltage state based on the fourth check signal CHK4, the fifth check signal CHK5, and the sixth check signal CHK6. When the stuck voltage state is detected, the controller 930 may activate the check signal CHK to inform the core circuit 111 or 121 that the stuck voltage state is detected.

For example, as described with reference to FIG. 17, in addition to the detection of the stuck voltage state, the monitor circuit 913 may be further configured to determine a voltage of the low level or the high level of the output signal OUT.

Figure 24:
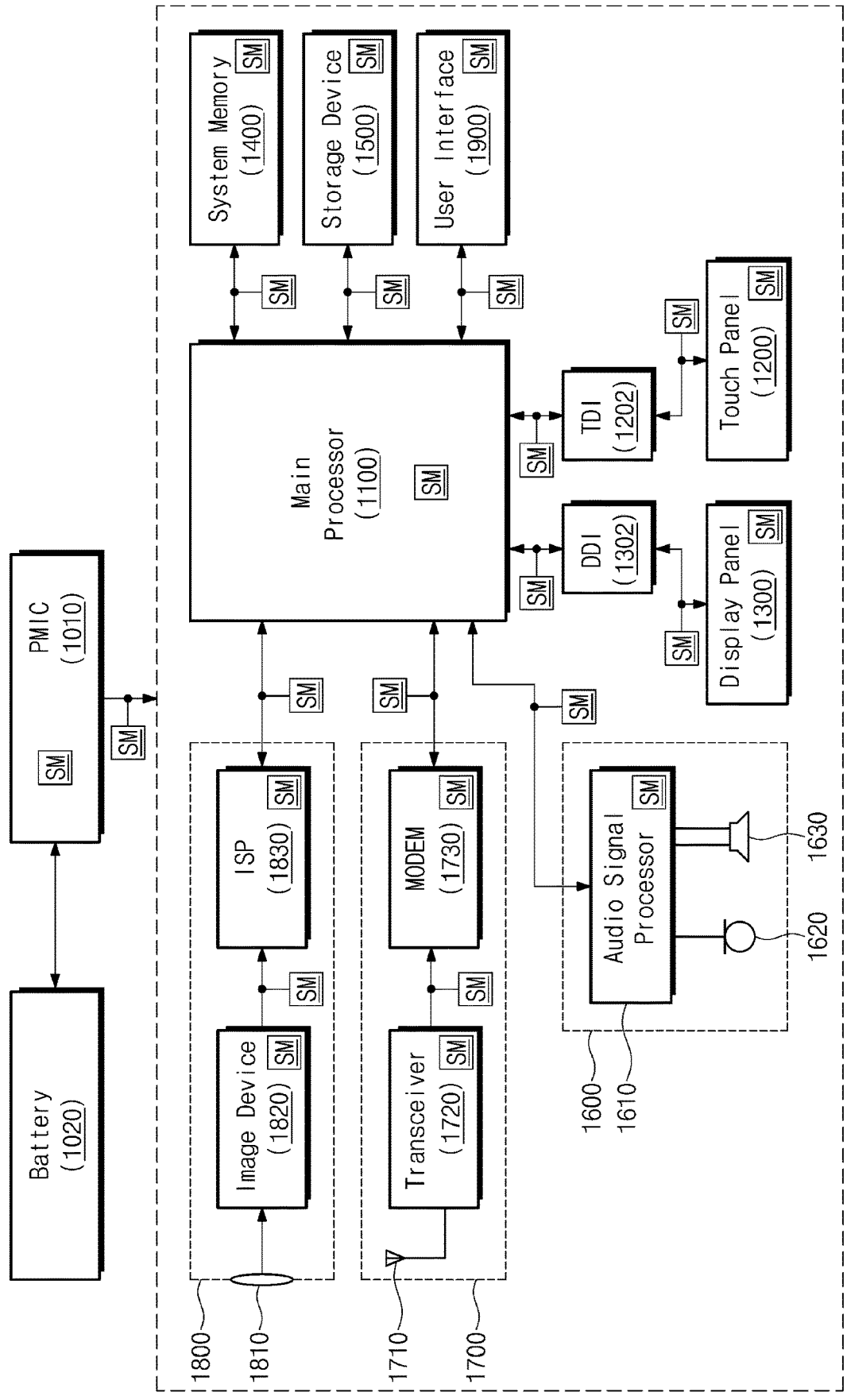
FIG. 24 illustrates an electronic device including an electronic device performing the DC-to-DC conversion according to an embodiment of the inventive concept

FIG. 24 is a block diagram illustrating an electronic device 1000 including the first or second electronic device 110 or 120 performing the DC-to-DC conversion according to the inventive concept. Referring to FIG. 24, the electronic device 1000 may include a main processor 1100, a touch panel 1200, a touch driver integrated circuit (TDI) 1202, a display panel 1300, a display driver integrated circuit (DDI) 1302, a system memory 1400, a storage device 1500, an audio processor 1600, a communication block 1700, an image processor 1800, and a user interface 1900. In an exemplary embodiment, the electronic device 1000 may be one of various electronic devices such as a personal computer, a laptop computer, a workstation, a portable communication terminal, a personal digital assistant (PDA), a portable media player (PMP), a digital camera, a smartphone, a tablet computer, and a wearable device.

The main processor 1100 may control overall operations of the electronic device 1000. The main processor 1100 may control/manage operations of the components of the electronic device 1000. The main processor 1100 may process various operations for the purpose of operating the electronic device 1000. The touch panel 1200 may be configured to sense a touch input from a user under control of the touch driver integrated circuit 1202. The display panel 1300 may be configured to display image information under control of the display driver integrated circuit 1302.

The system memory 1400 may store data that are used for an operation of the electronic device 1000. For example, the system memory 1400 may include a volatile memory such as a static random access memory (SRAM), a dynamic RAM (DRAM), or a synchronous DRAM (SDRAM), and/or a nonvolatile memory such as a phase-change RAM (PRAM), a magneto-resistive RAM (MRAM), a resistive RAM (ReRAM), or a ferroelectric RAM (FRAM).

The storage device 1500 may store data regardless of whether a power is supplied. For example, the storage device 1500 may include at least one of various nonvolatile memories such as a flash memory, a PRAM, an MRAM, a ReRAM, and a FRAM. For example, the storage device 1500 may include an embedded memory and/or a removable memory of the electronic device 1000.

The audio processor 1600 may process an audio signal by using an audio signal processor 1610. The audio processor 1600 may receive an audio input through a microphone 1620 or may provide an audio output through a speaker 1630. The communication block 1700 may exchange signals with an external device/system through an antenna 1710. A transceiver 1720 and a modulator/demodulator (MODEM) 1730 of the communication block 1700 may process signals exchanged with the external device/system, based on at least one of various wireless communication protocols: long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The image processor 1800 may receive a light through a lens 1810. An image device 1820 and an image signal processor (ISP) 1830 included in the image processor 1800 may generate image information about an external object, based on a received light. The user interface 1900 may include an interface capable of exchange information with a user, except for the touch panel 1200, the display panel 1300, the audio processor 1600, and the image processor 1800. The user interface 1900 may include a keyboard, a mouse, a printer, a projector, various sensors, a human body communication device, etc.

The electronic device 1000 may further include a power management IC (PMIC) 1010 and a battery 1020. The power management IC 1010 may generate an internal power from a power supplied from the battery 1020, and may provide the internal power to the main processor 1100, the touch panel 1200, the touch driver integrated circuit (TDI) 1202, the display panel 1300, the display driver integrated circuit (DDI) 1302, the system memory 1400, the storage device 1500, the audio processor 1600, the communication block 1700, the image processor 1800, and the user interface 1900.

Each of the components of the electronic device 1000 may include a safety monitor device SM. Also, the safety monitor device SM may be connected with each of channels between the components of the electronic device 1000. The safety monitor device SM may include the monitor circuit 113 or 123 according to an embodiment of the inventive concept for the purpose of detecting the stuck voltage state. The electronic device 1000 may be implemented in an in-vehicle infotainment system. The safety monitor device SM may be implemented based on the ISO26262 or the ASIL.

In the above embodiments, components according to the inventive concept are described by using the terms "first", "second", "third", and the like.

However, the terms "first", "second", "third", and the like may be used to distinguish components from each other and do not limit the inventive concept. For example, the terms "first", "second", "third", and the like do not involve an order or a numerical meaning of any form.

In the above embodiments, components according to embodiments of the inventive concept are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to the inventive concept, whether an output of a driver outputting a signal is in a stuck voltage state is detected based on an input signal and an output signal of the driver. Accordingly, an electronic device and a method for preventing an abnormal operation are provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:
1. An electronic device comprising:
a driver connected with a pin, and configured to receive an input signal and to output an output signal to the pin in response to the input signal;
a core circuit configured to transfer the input signal to the driver; and
a monitor circuit configured to receive the input signal and the output signal and to detect a stuck voltage state of the output signal based on the input signal and the output signal,
wherein the monitor circuit includes:

a first detection circuit configured to detect the stuck voltage state when the input signal and the output signal are logically incorrect;
a second detection circuit configured to detect the stuck voltage state when the input signal and the output signal are logically correct and when the output signal is at a low level; and
a third detection circuit configured to detect the stuck voltage state when the input signal and the output signal are logically correct and when the output signal is at a high level.

2. The electronic device of claim 1, wherein the first detection circuit includes:
an exclusive OR gate configured to detect the stuck voltage state in response to a logical level of the input signal and a logical level of the output signal being the same.

3. The electronic device of claim 1, wherein
the second detection circuit deactivates the driver and drains a current from an output node of the driver,
the second detection circuit stepwise decreases an amount of the current drained from the output node of the driver, and
in response to a voltage of the output node being greater than a reference voltage, the second detection circuit detects that the output node is not stuck to a ground voltage.

4. The electronic device of claim 3, wherein the second detection circuit detects that the output node is stuck to the ground voltage, in response to the voltage of the output node being maintained below the reference voltage.

5. The electronic device of claim 3, wherein the reference voltage is smaller than a highest voltage at which an external device connected with the pin identifies a logical level of the output signal as a low level.

6. The electronic device of claim 3, wherein the second detection circuit detects a level of the voltage of the output node, in response to the voltage of the output node being greater than a second reference voltage that is different from the reference voltage.

7. The electronic device of claim 3, wherein, in response to the voltage of the output node being greater than the reference voltage, the second detection circuit activates the driver and the second detection circuit is deactivated.

8. The electronic device of claim 1, wherein the third detection circuit deactivates the driver and drains a current from an output node of the driver,
wherein the third detection circuit stepwise increases an amount of the current drained from the output node of the driver, and
wherein, in response to a voltage of the output node being smaller than a reference voltage, the third detection circuit detects that the output node is not stuck to a power supply voltage.

9. The electronic device of claim 8, wherein the third detection circuit detects that the output node is stuck to the power supply voltage, in response to the voltage of the output node being maintained above the reference voltage.

10. The electronic device of claim 8, wherein the reference voltage is greater than a lowest voltage at which an external device connected with the pin identifies a logical level of the output signal as a high level.

11. The electronic device of claim 8, wherein the third detection circuit detects a level of the voltage of the output node, in response to the voltage of the output node being smaller than a second reference voltage that is different from the reference voltage.

12. The electronic device of claim 8, wherein, in response to the voltage of the output node being smaller than the reference voltage, the third detection circuit activates the driver and the third detection circuit is deactivated.

13. The electronic device of claim 1, wherein the second detection circuit deactivates the driver and supplies a current to an output node of the driver,
wherein the second detection circuit stepwise increases an amount of the current supplied to the output node of the driver, and
wherein, in response to a voltage of the output node being greater than a reference voltage, the second detection circuit detects that the output node is not stuck to a ground voltage.

14. The electronic device of claim 1, wherein power-off of the electronic device is performed in response to the stuck voltage state being detected.

15. The electronic device of claim 1, wherein the core circuit generates second voltages from a first voltage received externally and performs power management such that the second voltages are output, and
wherein the driver is associated with an general-purpose input/output (GPIO).

16. A method of monitoring an output signal of a driver, comprising:
comparing an input signal and the output signal of the driver and detecting a stuck voltage state in response to the input signal and the output signal being logically incorrect; and
adjusting a voltage of an output node when the input signal and the output signal are logically correct and detecting the stuck voltage state in response to a voltage of the output node not varying.

17. The method of claim 16, wherein the adjusting of the voltage of the output node when the input signal and the output signal are logically correct and the detecting of the stuck voltage state in response to that the voltage of the output node not varying includes:
increasing of the voltage of the output node when the output signal is at a logically low level; and
decreasing of the voltage of the output node when the output signal is at a logically high level.

* * * * *